United States Patent
Kim et al.

(10) Patent No.: US 11,664,285 B2
(45) Date of Patent: *May 30, 2023

(54) ELECTRONIC PACKAGES INCLUDING STRUCTURED GLASS ARTICLES AND METHODS FOR MAKING THE SAME

(71) Applicant: CORNING INCORPORATED, Corning, NY (US)

(72) Inventors: Jin Su Kim, Seoul (KR); Scott Christopher Pollard, Big Flats, NY (US)

(73) Assignee: CORNING INCORPORATED, Corning, NY (US)

( * ) Notice: Subject to any disclaimer, the term of this patent is extended or adjusted under 35 U.S.C. 154(b) by 47 days.

This patent is subject to a terminal disclaimer.

(21) Appl. No.: 17/044,713

(22) PCT Filed: Apr. 3, 2019

(86) PCT No.: PCT/US2019/025518
§ 371 (c)(1),
(2) Date: Oct. 1, 2020

(87) PCT Pub. No.: WO2019/195378
PCT Pub. Date: Oct. 10, 2019

(65) Prior Publication Data
US 2021/0043528 A1  Feb. 11, 2021

Related U.S. Application Data

(60) Provisional application No. 62/652,271, filed on Apr. 3, 2018.

(51) Int. Cl.
*H01L 23/15* (2006.01)
*H01L 21/50* (2006.01)
(Continued)

(52) U.S. Cl.
CPC .............. *H01L 23/15* (2013.01); *H01L 21/50* (2013.01); *H01L 23/36* (2013.01);
(Continued)

(58) Field of Classification Search
CPC ..... H01L 23/15; H01L 23/36; H01L 23/5384; H01L 23/5389; H01L 23/66; H01L 21/50; H01L 24/14
(Continued)

(56) References Cited

U.S. PATENT DOCUMENTS

| 4,130,680 A | 12/1978 | Ference et al. |
| 6,646,609 B2 | 11/2003 | Yuasa et al. |

(Continued)

FOREIGN PATENT DOCUMENTS

| CN | 104377188 A | 2/2015 |
| CN | 105392751 A | 3/2016 |

(Continued)

OTHER PUBLICATIONS

Buch et al; "Design and Demonstration of Highly Miniaturized, Low Cost Panel Level Glass Package for MEMS Sensors".
(Continued)

*Primary Examiner* — Quoc D Hoang
(74) *Attorney, Agent, or Firm* — Daniel J. Greenhalgh

(57) ABSTRACT

An electronic package assembly includes a glass substrate including an upper glass cladding layer, a lower glass cladding layer, a glass core layer coupled to the upper glass cladding layer and the lower glass cladding layer, where the upper glass cladding layer and the lower glass cladding layer have a higher etch rate in an etchant than the glass core layer, a first cavity positioned within one of the upper glass cladding layer or the lower glass cladding layer, and a second cavity positioned within one of the upper glass cladding layer or the lower glass cladding layer, a micro-
(Continued)

processor positioned within the first cavity, and a microelectronic component positioned within the second cavity.

20 Claims, 13 Drawing Sheets

(51) Int. Cl.
    *H01L 23/36*    (2006.01)
    *H01L 23/538*   (2006.01)
    *H01L 23/66*    (2006.01)
    *H01L 23/00*    (2006.01)
    *H05K 1/02*     (2006.01)
    *H05K 1/03*     (2006.01)

(52) U.S. Cl.
    CPC ...... *H01L 23/5384* (2013.01); *H01L 23/5389* (2013.01); *H01L 23/66* (2013.01); *H01L 24/14* (2013.01); *H05K 1/0206* (2013.01); *H05K 1/0306* (2013.01)

(58) Field of Classification Search
    USPC ........................................................ 257/737
    See application file for complete search history.

(56) References Cited

U.S. PATENT DOCUMENTS

| | | |
|---|---|---|
| 7,982,684 B2 | 7/2011 | O'Connell et al. |
| 8,497,804 B2 | 7/2013 | Haubrich et al. |
| 9,196,965 B2 | 11/2015 | Sabielny |
| 9,340,451 B2 | 5/2016 | Boek et al. |
| 9,496,596 B2 | 11/2016 | Chirila |
| 11,367,665 B2 * | 6/2022 | Boek ...................... C03C 15/00 |
| 2010/0141550 A1 | 6/2010 | Li |
| 2011/0195360 A1 | 8/2011 | Flemming et al. |
| 2012/0025245 A1 | 2/2012 | Nakamura et al. |
| 2014/0238078 A1 | 8/2014 | Boek et al. |
| 2015/0293441 A1 | 10/2015 | Shishido et al. |
| 2016/0153888 A1* | 6/2016 | Hook ................... G02B 6/1221 |
| | | 435/288.7 |
| 2017/0073266 A1 | 3/2017 | Amosov et al. |
| 2019/0295952 A1* | 9/2019 | Sikka ..................... H01L 24/17 |

FOREIGN PATENT DOCUMENTS

| | | |
|---|---|---|
| GB | 2315266 A | 1/1998 |
| JP | 2000-178036 A | 6/2000 |
| WO | 2014/080935 A1 | 5/2014 |
| WO | 2019/023213 A1 | 1/2019 |

OTHER PUBLICATIONS

International Search Report and Written Opinion of the International Searching Authority; PCT/US2019/025518; dated Jun. 28, 2019; 11 Pages; European Patent Office.

Chinese Patent Application No. 201980034037.7, Office Action dated May 25, 2022, 4 pages (English Translation only), Chinese Patent Office.

* cited by examiner

ELECTRONIC PACKAGES INCLUDING STRUCTURED GLASS ARTICLES AND METHODS FOR MAKING THE SAME

CROSS-REFERENCE TO RELATED APPLICATIONS

This application claims the benefit of priority under 35 U.S.C. § 371 of International Application No. PCT/US2019/025518, filed on Apr. 3, 2019, which claims the benefit of priority under 35 U.S.C. § 119 of U.S. Provisional Application No. 62/652,271, filed Apr. 3, 2018, the content of each of which is incorporated herein by reference in its entirety.

BACKGROUND

1. Field

This disclosure relates to electronic packages including microprocessors positioned within structured glass articles and methods for making the same.

2. Technical Background

Electronic devices, such as mobile devices, consumer electronics, computing devices and the like, include various electronic components, such as microprocessors, memory chips, passive components, and/or radio frequency (RF) components. These electronic components may be electrically coupled to one another and may cooperate to perform various functions of the electronic device. In conventional configurations, each of the electronic components may be individually coupled to a substrate to form a "package," and the separate packages may be electronically coupled to one another within the electronic device, such as in package on package (PoP) configuration. The electronic components may also or alternatively be individually coupled to a printed circuit board (PCB). The individual packaging of the electronic components and/or the space occupied by the PCB contributes to the geometric space occupied by the electronic components, and in some applications, such as when the electronic components are incorporated into a mobile device, it is desirable to minimize the space occupied by the electronic components (i.e., to minimize the form factor of the electronic components). Furthermore the individual packaging of the electronic components may increase a distance between the electronic components, leading to processing delays and increased power consumption.

In some conventional configurations, the electronic components may be mounted to a polymer substrate and/or may be coupled to a substrate with a polymer adhesive. As the electronic components are heated and cooled during operation, mismatch between a coefficient of thermal expansion (CTE) of the electronic components and the polymer substrate and/or polymer adhesive may cause the polymer substrate and/or polymer adhesive to expand and contract at a different rate than the electronic components. The difference in the expansion and contraction of the polymer substrate and/or polymer adhesive and the electronic components may cause stress at interfaces between the polymer substrate and/or polymer adhesive and the electronic components, which can lead to failure of the substrate and/or the electronic components.

Additionally, the electronic components may send and receive signals across a wide range of frequencies, and at relatively high frequencies, the dielectric constant of the polymer substrate and/or the polymer adhesive may contribute to signal loss, absorbing at least a portion of the signals sent and received by the electronic components.

Accordingly, a need exists for electronic component packaging with a minimal form factor. A need also exists for electronic component packaging that minimizes signal loss and that minimize stresses associated with thermal expansion.

SUMMARY

In one embodiment, an electronic package assembly includes a glass substrate including an upper glass cladding layer, a lower glass cladding layer, a glass core layer coupled to the upper glass cladding layer and the lower glass cladding layer, where the upper glass cladding layer and the lower glass cladding layer have a higher etch rate in an etchant than the glass core layer, a first cavity positioned within one of the upper glass cladding layer or the lower glass cladding layer, and a second cavity positioned within one of the upper glass cladding layer or the lower glass cladding layer, a microprocessor positioned within the first cavity, and a micro-electronic component positioned within the second cavity.

In another embodiment, a wafer-level electronic package assembly includes a glass substrate including an upper glass cladding layer, a lower glass cladding layer, a glass core layer coupled to the upper glass cladding layer and the lower glass cladding layer, where the upper glass cladding layer and the lower glass cladding layer have a higher etch rate in an etchant than the glass core layer, a plurality of first cavities positioned within one of the upper glass cladding layer or the lower glass cladding layer, and a plurality of second cavities positioned within one of the upper glass cladding layer or the lower glass cladding layer, a plurality of microprocessors positioned within the plurality of first cavities, and a plurality of micro-electronic components positioned within the plurality of second cavities.

In yet another embodiment, a method for forming an electronic package assembly includes applying a mask to a surface of a glass substrate includes a glass cladding layer coupled to a glass core layer such that the mask is positioned on the glass cladding layer, the mask including one or more open regions at which the glass cladding layer remains uncovered by the mask, the glass cladding layer having a higher etch rate in an etchant than the glass core layer, exposing the glass substrate to the etchant, thereby selectively etching a portion of the glass cladding layer and forming one or more cavities in the glass substrate, and positioning a micro-electronic component within the one or more cavities of the glass substrate.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DETAILED DESCRIPTION

Figure 1:
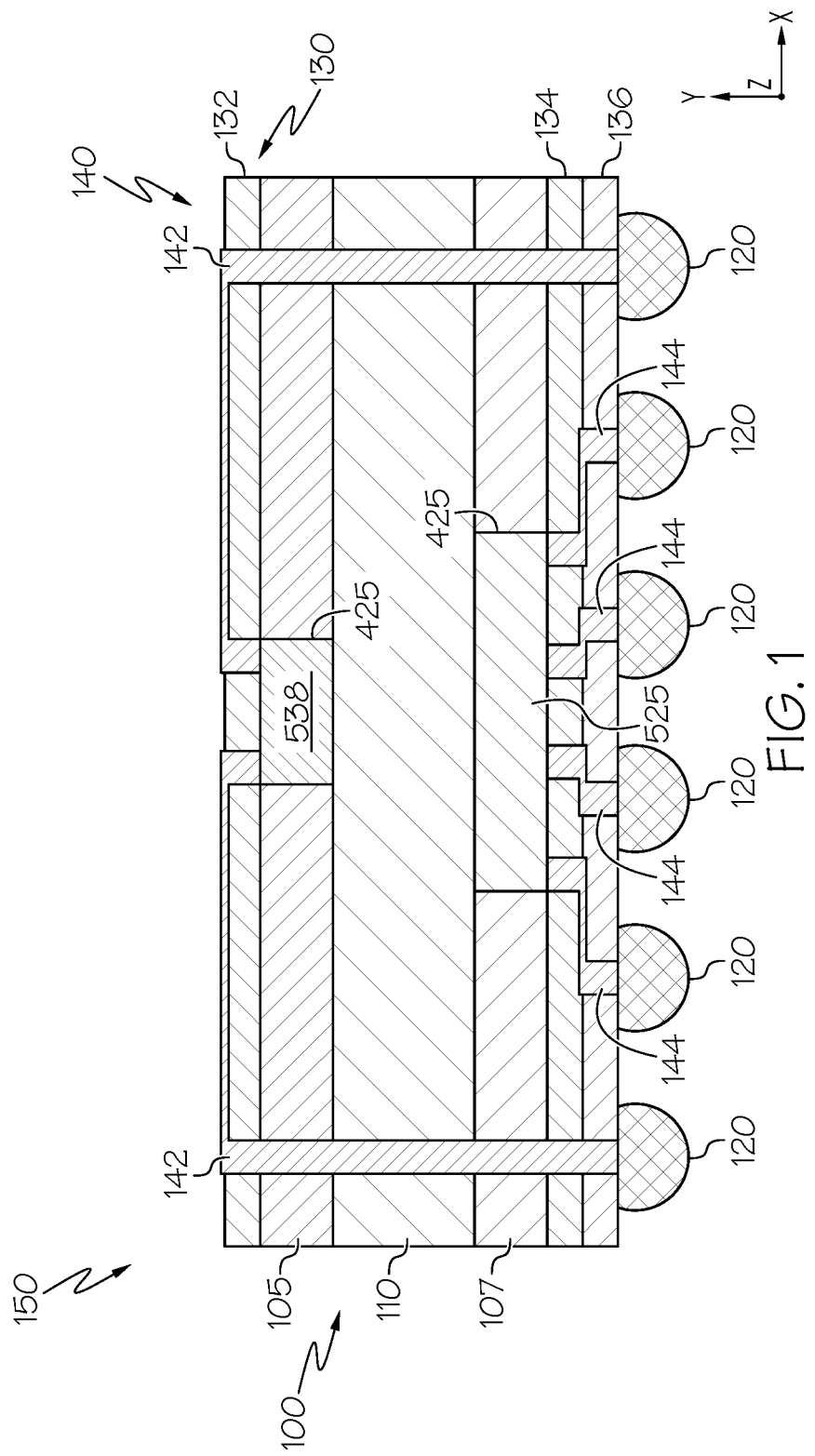
FIG. 1 schematically depicts a cross-section of an electronic package assembly including a microprocessor and a memory chip, according to one or more embodiments shown and described herein.

Reference will now be made in detail to exemplary embodiments which are illustrated in the accompanying drawings. Whenever possible, the same reference will be used throughout the drawings to refer to the same or like parts. The components in the drawings are not necessarily to scale, emphasis instead being placed upon illustrating the principles of the exemplary embodiments.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

In various embodiments, an electronic package assembly includes a glass substrate including an upper glass cladding layer, a glass core layer coupled to the upper glass cladding layer, and a lower glass cladding layer coupled to the glass core layer. Multiple electronic components, such as microprocessors, memory chips, passive elements, and analog RF devices may be positioned within cavities of the glass substrate. By including multiple electronic components within the same electronic package assembly, the distance between the electronic components may be minimized, thereby reducing latency delays and minimizing the form factor of the electronic package assembly. Furthermore, by utilizing a glass substrate, dielectric loss and thermal stress may be minimized. To assist with the formation of precise cavities within the upper and lower glass cladding layers, the upper and lower glass cladding layers may have a higher etch rate in an etchant than the glass core layer and/or may have a higher photosensitivity to facilitate photomachining of the upper and lower glass cladding layers, as is described in greater detail herein.

As used herein, the term "micro-electronic elements" may be used generically to describe memory chips, passive elements, analog RF devices, and passive RF devices, and the like.

Referring initially to FIG. 1, a cross-sectional view of an electronic package assembly 150 is schematically depicted. In the embodiment depicted in FIG. 1, the electronic package assembly 150 includes a microprocessor 525 and a micro-electronic element, namely a memory chip 538, that are both positioned on a glass substrate 100. In particular, the microprocessor 525 and the memory chip 538 are each positioned within cavities 425 that are formed within the glass substrate 100. The glass substrate 100, along with the microprocessor 525 and the memory chip 538, may be covered by one or more dielectric polymer layers 130 positioned on a top and a bottom of the glass substrate 100. In the embodiment depicted in FIG. 1, the electronic package assembly 150 includes an upper dielectric polymer layer 132 positioned on the top of the glass substrate 100, and includes a pair of lower dielectric polymer layers 134, 136 positioned on the bottom of the glass substrate 100. The dielectric polymer layers 130 may be formed from any suitable polymer having desired dielectric properties for packaging electronics, and may be formed through any suitable process.

The electronic package assembly 150 further includes vias 140 extending through the dielectric polymer layers 130 and the glass substrate 100. The vias 140 electrically and/or communicatively couple the microprocessor 525 and the memory chip 538 to solder bumps 120 positioned on the bottom of the lower dielectric polymer layer 136. In the embodiment depicted in FIG. 1, the electronic package assembly 150 includes a pair of vias 142 that extend through the glass substrate 100 between the memory chip 538 and a pair of solder bumps 120. The electronic package assembly 150 further includes vias 144 that extend between the microprocessor 525 and a set of solder bumps 120 through the lower dielectric polymer layers 134, 136. In some embodiments, vias 140 may also extend directly between the microprocessor 525 and the memory chip 538. The vias 140 may be formed from any suitable material for conducting electrical signals, such as copper or the like, and may be formed through any suitable process, such as sputtering deposition, paste fill or plating (conformal or fill), or any combination thereof.

The memory chip 538 is generally a silicon-based structure having an integrated circuit that may be utilized to store data and programs temporarily or permanently. The microprocessor 525 is also generally a silicon-based structure, and may generally include an application processor having a system on chip (SoC) integrated circuit, as may be utilized in mobile applications. In other embodiments, the microprocessor 525 may include a general purpose microprocessor.

The glass substrate 100 includes multiple glass layers, and in the embodiment depicted in FIG. 1, the glass substrate 100 includes a glass central core 110 coupled to an upper glass cladding layer 105 and an optional lower glass cladding layer 107. The upper glass cladding layer 105 is positioned above the glass central core 110 in a vertical direction (i.e., in the +y-direction as depicted) and the lower glass cladding layer 107 is positioned below the glass central core 110 in the vertical direction. In some embodiments, the glass central core 110, the upper glass cladding layer 105, and the lower glass cladding layer 107 are directly fused to one another without any adhesives, polymer layers, coating layers or the like positioned between them. In other embodiments, the glass central core 110, the upper glass cladding layer 105, and the lower glass cladding layer 107 are coupled to one another using adhesives or the like.

The glass central core 110, the upper glass cladding layer 105, and the lower glass cladding layer 107 can have any suitable composition of glass and be made using any suitable process. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, the glass central core 110, the upper glass cladding layer 105, and the lower glass cladding layer 107 can have any of the compositions discussed in the '451 patent or the '266 application or be made using any of the processes discussed in the '451 patent or the '266 application, each of which is referenced at the end of the description.

In embodiments, at least one of the upper glass cladding layer 105, the lower glass cladding layer 107, and the glass central core 110 have different physical dimensions and/or glass compositions that allow for selective removal of the at least one of the upper glass cladding layer 105 and the lower glass cladding layer 107 relative to the glass central core 110 to form the cavities 425.

For example, in some embodiments, the upper glass cladding layer 105 and the lower glass cladding layer 107 have the same glass composition, while the glass central core 110 has a different glass composition. In particular, in some embodiments, the glass compositions of the upper glass cladding layer 105, the lower glass cladding layer 107, and the glass central core 110 can vary such that the durability of the upper glass cladding layer 105, the lower glass cladding layer 107, and the glass central core 110 in an etchant varies. For example, it can be desirable for one or both of the upper glass cladding layer 105 and lower glass cladding layer 107 to have a dissolution rate in the etchant that is different than the glass central core 110. The different durability between the upper glass cladding layer 105, the lower glass cladding layer 107, and the glass central core 110 makes it possible to form the cavities 425 in the surface of the glass substrate 100. For example, the upper glass cladding layer 105 and the lower glass cladding layer 107 can have a sufficiently high dissolution rate in the etchant that they can be etched to form the cavities 425. On the other hand, the glass central core 110 can have a sufficiently low dissolution rate in the etchant that it is not substantially susceptible to being etched. The glass central core 110 can have a dissolution rate in the etchant that is zero or sufficiently close to zero that it is insusceptible to being etched to any significant extent. Thus, the glass central core 110 can act as an etch stop to limit the depth to which the glass substrate 100 can be etched using the etchant.

In other embodiments, such as embodiments in which the cavities 425 are formed from a process other than wet etching, the upper glass cladding layer 105, the lower glass cladding layer 107, and the glass central core 110 may have the same or substantially the same glass composition.

In embodiments, the thickness of the upper glass cladding layer 105, the lower glass cladding layer 107, and the glass central core 110 (evaluated in the y-direction as depicted) may be selected based on the thickness (evaluated in the y-direction as depicted) of the microprocessor 525 and/or the memory chip 538. In particular, the thickness of the upper glass cladding layer 105 and the lower glass cladding layer 107 may be selected to correspond to the thickness (evaluated in the y-direction as depicted) of the memory chip 538 and the microprocessor 525, respectively. In some embodiments, one or both of the upper glass cladding layer 105 and the lower glass cladding layer 107 have a thickness that is selected between 50 micrometers (μm) and 100 μm. It should be appreciated, however, that the upper glass cladding layer 105 and lower glass cladding layer 107 can have other thicknesses, particularly, when used with memory chips 538 and microprocessors 525 having smaller or larger thicknesses than those disclosed. In some embodiments, the upper glass cladding layer 105 and the lower glass cladding layer 107 have the same thickness, such that the glass substrate 100 is symmetric in the vertical direction. In other embodiments, the upper glass cladding layer 105 and the lower glass cladding layer 107 may have different thicknesses, such as in embodiments in which the microprocessor 525 and the memory chip 538 have different thicknesses.

By positioning the memory chip 538 in the same electronic package assembly 150 as the microprocessor 525, the physical distance between the memory chip 538 and the microprocessor 525 may be minimized as compared to conventional configurations in which the memory chip 538 and the microprocessor 525 are packaged individually. For example, in conventional configurations where the memory chip 538 and the microprocessor 525 are positioned in separate packages, the memory chip 538 may be positioned above or below the microprocessor 525, such as in a PoP configuration, or may be positioned alongside the memory chip 538 (i.e., in the z-direction or the x-direction as depicted). However, positioning the memory chip 538 alongside the microprocessor 525 increases the space occupied by the memory chip 538 and the microprocessor 525 (and their surrounding packages) in the z-direction and/or the x-direction, as compared to the embodiment depicted in FIG. 1 in which the microprocessor 525 and the memory chip 538 are encapsulated within the same electronic package assembly 150. For example, the space occupied by the microprocessor 525 and the memory chip 538 may be reduced by up to 95% by packaging the microprocessor 525 and the memory chip 538 in the same package, as compared when the microprocessor 525 and the memory chip 538 are packaged separately and placed alongside one another.

Similarly, in conventional configurations in which the memory chip 538 and the microprocessor 525 are positioned in separate packages and the memory chip 538 is positioned above or below the microprocessor 525, the space occupied by the memory chip 538 and the microprocessor 525 is increased in the y-direction, as compared to the embodiment depicted in FIG. 1 in which the microprocessor 525 and the memory chip 538 are encapsulated within the same electronic package assembly 150. In particular, when the microprocessor 525 and the memory chip 538 are positioned in separate packages, solder bumps are conventionally positioned between the separate packages in the vertical direction to create a connection between the microprocessor 525 and the memory chip 538, thereby increasing the space occupied by the microprocessor 525 and the memory chip 538 (and their surrounding packages), as compared to the embodiment depicted in FIG. 1, in which the microprocessor 525 and the memory chip are encapsulated within the same electronic package assembly 150. Solder bumps typically have a diameter of between 100 µm and 200 µm, such that the space occupied by the microprocessor 525 and the memory chip 538 (and associated packaging) may be reduced by as much as 200 µm in the y-direction as depicted by packaging the microprocessor 525 and the memory chip 538 in the same package. In this way, the space occupied by the microprocessor 525 and the memory chip 538 (and packaging surrounding package(s)) may be minimized, minimizing the form factor of the microprocessor 525 and the memory chip 538. Minimal form factor may be particularly desirable in mobile applications where space may be limited.

Furthermore, reducing the layers of solder bumps may also reduce signal loss. For example, as described above, in conventional configurations where the microprocessor 525 and the memory chip 538 are packaged separately, solder bumps are conventionally positioned between the separate packages in the vertical direction to create a connection between the microprocessor 525 and the memory chip 538 packages. The microprocessor 525 and the memory chip 538 may also be positioned on a printed circuit board, with solder bumps positioned between the printed circuit board and the stacked microprocessor 525 and memory chip 538. Accordingly, in an example where the microprocessor 525 is positioned below the memory chip 538, for an electrical signal to pass between the memory chip 538 and the printed circuit board, the signal would first travel through the solder bumps between the memory chip 538 and the microprocessor 525 package, and then through the solder bumps between the microprocessor 525 package and the printed circuit board, ultimately passing through two separate layers of solder bumps.

By contrast, by packaging the microprocessor 525 and the memory chip 538 in the same package, signals to or from the microprocessor 525 and the memory chip 538 may only need to pass through the vias 140 and the single layer of solder bumps 120. Solder bumps may generally be formed from a composite of materials that assist with the manufacturing of the solder bumps, but which may contribute to the loss of electrical signals. Accordingly, by limiting the number of solder bumps required to make an electrical connection, signal loss may be reduced.

Further, as compared to conventional configurations in which the memory chip 538 is packaged separately from the microprocessor 525, positioning the memory chip 538 and the microprocessor 525 in the same electronic package assembly 150 decreases the physical distance between the microprocessor 525 and the memory chip 538. For example, in conventional configurations in which the microprocessor 525 and the memory chip 538 are packaged separately, the microprocessor 525 and the memory chip 538 may be spaced apart from one another such that a path length (e.g., the distance between the microprocessor 525 and the memory chip 538 evaluated along an electrical pathway) between the microprocessor 525 and the memory chip 538 is between 8 millimeters (mm) and 18 mm. By contrast, by packaging the microprocessor 525 and the memory chip 538 within the same package, the path length between the microprocessor 525 and the memory chip 538 may be reduced to between 200 µm and 800 µm, inclusive of the endpoints. Without being bound by theory, the microprocessor 525 may be capable of computing at speeds that are faster than the time for electrical signals to be sent and received by the memory chip 538. As such the distance between the microprocessor 525 and the memory chip 538 may limit the time for the microprocessor 525 to perform operations. Accordingly, by minimizing the distance between the microprocessor 525 and the memory chip 538, such as by encapsulating the microprocessor 525 and the memory chip 538 within the same electronic package assembly 150, latency delays of the microprocessor 525 may be minimized as compared to conventional configurations in which the microprocessor 525 and the memory chip 538 are separately packaged.

The glass substrate 100 may further reduce the delay and cross-talk of signals sent between the memory chip 538 and the microprocessor 525 as compared to conventional configurations in which the memory chip 538 and the microprocessor 525 are positioned on a polymer substrate. Without being bound by theory, it is desirable to utilize substrates having comparatively low dielectric constants to minimize the cross talk of signals sent between electronic components on the substrate and minimize propagation delay. Polymers, such as those used in conventional packaging, may have a comparatively large dielectric constant and may also have a large range of dielectric constants at different frequencies. By contrast, glass, such as may be utilized for the glass substrate 100, may have a relatively low dielectric constant that remains comparatively stable across a wide range of frequencies. In one example, the upper glass cladding layer 105, the lower glass cladding layer 107, and the glass central core 110 of the glass substrate 100 may have a loss tangent of between about 0.004 and 0.042 at 10 gigahertz (GHz) and may have a loss tangent of between about 0.006 and 0.054 at 60 GHz. By contrast, the loss tangent of conventional polymers may be up to 10 times higher than that of the glass substrate at 10 GHz. Accordingly, by utilizing the glass substrate 100 to form the electronic package assembly 150, the electronic package assembly 150 may provide a relatively low dielectric constant medium that remains stable at relatively high frequencies, as compared to electronic packages utilizing polymer based substrates.

Furthermore, the glass substrate 100 may provide a substrate for the memory chip 538 and the microprocessor 525 that expands and contracts under thermal changes in a similar manner to the memory chip 538 and the microprocessor 525. As an example, the memory chip 538 and the microprocessor 525 are generally semiconductor-based structures, and may have a coefficient of thermal expansion (CTE) of about 2-3 parts per million (ppm)/° C. The upper glass cladding layer 105 and the lower glass cladding layer may have a CTE between about 7.6-9.5 ppm/° C., inclusive of the endpoints, and the glass central core layer 110 may have a CTE between about 7.5-9.1 ppm/° C., inclusive of the endpoints. By contrast, the CTE of polymers conventionally used in electronic component packaging, such as FR-4 laminate, have a CTE of 14 to 17 ppm/° C. Accordingly, the CTE of the glass substrate 100 is closer to the CTE of the memory chip 538 and the microprocessor 525 as compared to the polymers used in conventional electronic component packaging. By more closely matching the CTE of the memory chip 538 and the microprocessor 525, the glass substrate 100 may expand and contract under thermal changes in a manner similar to the memory chip 538 and the microprocessor 525, thereby reducing stress at interfaces between the memory chip 538/microprocessor 525 and the glass substrate 100 as compared to conventional polymer-based substrates. Furthermore, the comparatively low CTE of the glass substrate 100 may assist in reducing warping of the electronic packaging assembly 150 when the glass substrate 100 is heated and cooled.

It should be appreciated that numerous changes can be made to the embodiments of the glass substrate 100 shown in FIG. 1. For example, in some embodiments, the glass substrate 100 can include only two glass layers, such as the upper glass cladding layer 105 and the glass central core 110. In other embodiments, the glass substrate 100 can include four or more glass layers. Numerous other variations are also contemplated.

Figure 2:
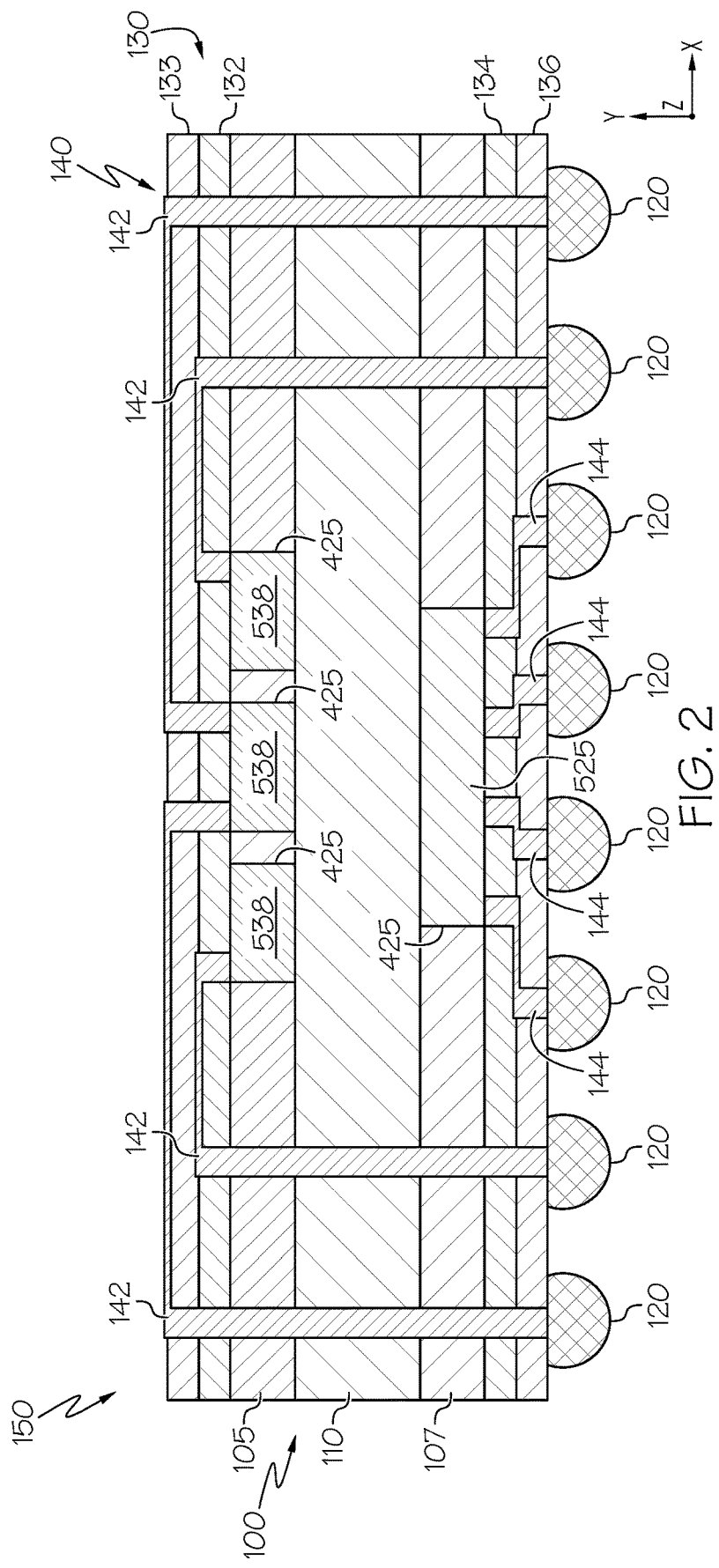
FIG. 2 schematically depicts a cross-section of another electronic package assembly including a microprocessor and multiple memory chips, according to one or more embodiments shown and described herein.

Referring to FIG. 2, in another embodiment, the electronic package assembly 150 includes multiple memory chips 538 positioned within cavities 425 of the glass substrate 100. Like the embodiment shown in FIG. 1, the glass substrate 100 includes the upper glass cladding layer 105, the glass central core 110, and lower glass cladding layer 107. The electronic package assembly 150 further includes the microprocessor 525 positioned within a cavity 425 of the lower glass cladding layer 107. However, in the embodiment shown in FIG. 2, the electronic package assembly 150 includes multiple memory chips 538 positioned within cavities 425 of the upper glass cladding layer 105. The electronic package assembly 150 may include additional vias 142 extending from the memory chips 538 to the solder bumps 120 as compared to the embodiment shown in FIG. 1, and may additionally include another upper dielectric polymer layer 133 positioned above the upper dielectric polymer layer 132 to carry the additional vias 142. As with the embodiment described above and shown in FIG. 1, by including the memory chips 538 and the microprocessor 525 within the same electronic package assembly 150, the distance between the memory chips 538 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 3:
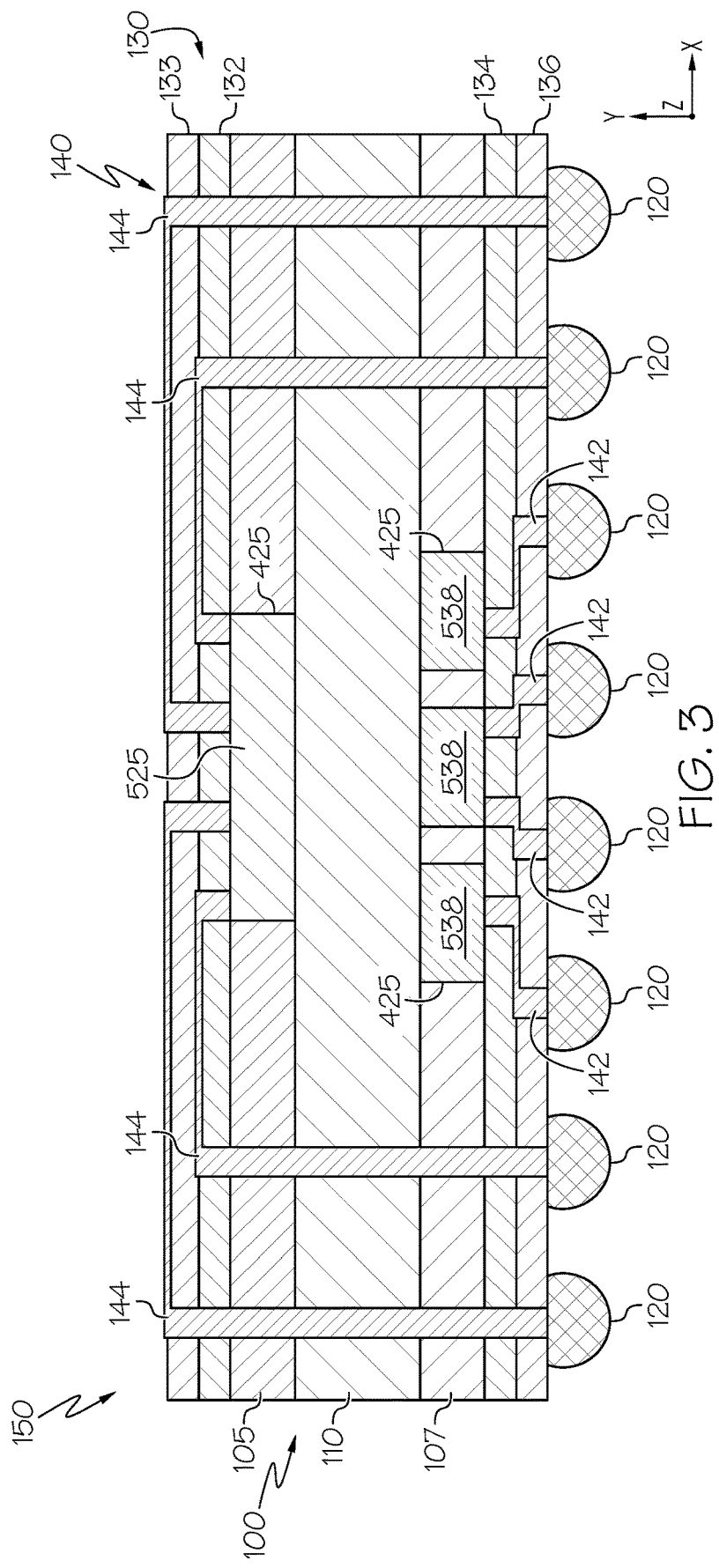
FIG. 3 schematically depicts a cross-section of another electronic package assembly including a microprocessor and multiple memory chips where the memory chips are positioned below the microprocessor, according to one or more embodiments shown and described herein.

Referring to FIG. 3, in another embodiment, the electronic package assembly 150 includes multiple memory chips 538 positioned within the cavities 425 of the glass substrate 100, similar to the embodiment depicted in FIG. 2. In the embodiment depicted in FIG. 3, the memory chips 538 are positioned within cavities 425 in the lower glass cladding layer 107, while the microprocessor 525 is positioned within a cavity 425 of the upper glass cladding layer 105. As the memory chips 538 are positioned within the lower glass cladding layer 107, the memory chips 538 are positioned closer to the solder bumps 120, as compared to the microprocessor 525 positioned within the upper glass cladding layer 105. By positioning the memory chips 538 close to the solder bumps 120, the number of vias 142 required to connect the memory chips 538 to the solder bumps 120 may be reduced, which may be particularly desirable when the electronic package assembly 150 includes multiple memory chips 538. Similar to the embodiments described above and depicted in FIGS. 1 and 2, by including the memory chips 538 and the microprocessor 525 within the same electronic package assembly 150, the distance between the memory chips 538 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 4:
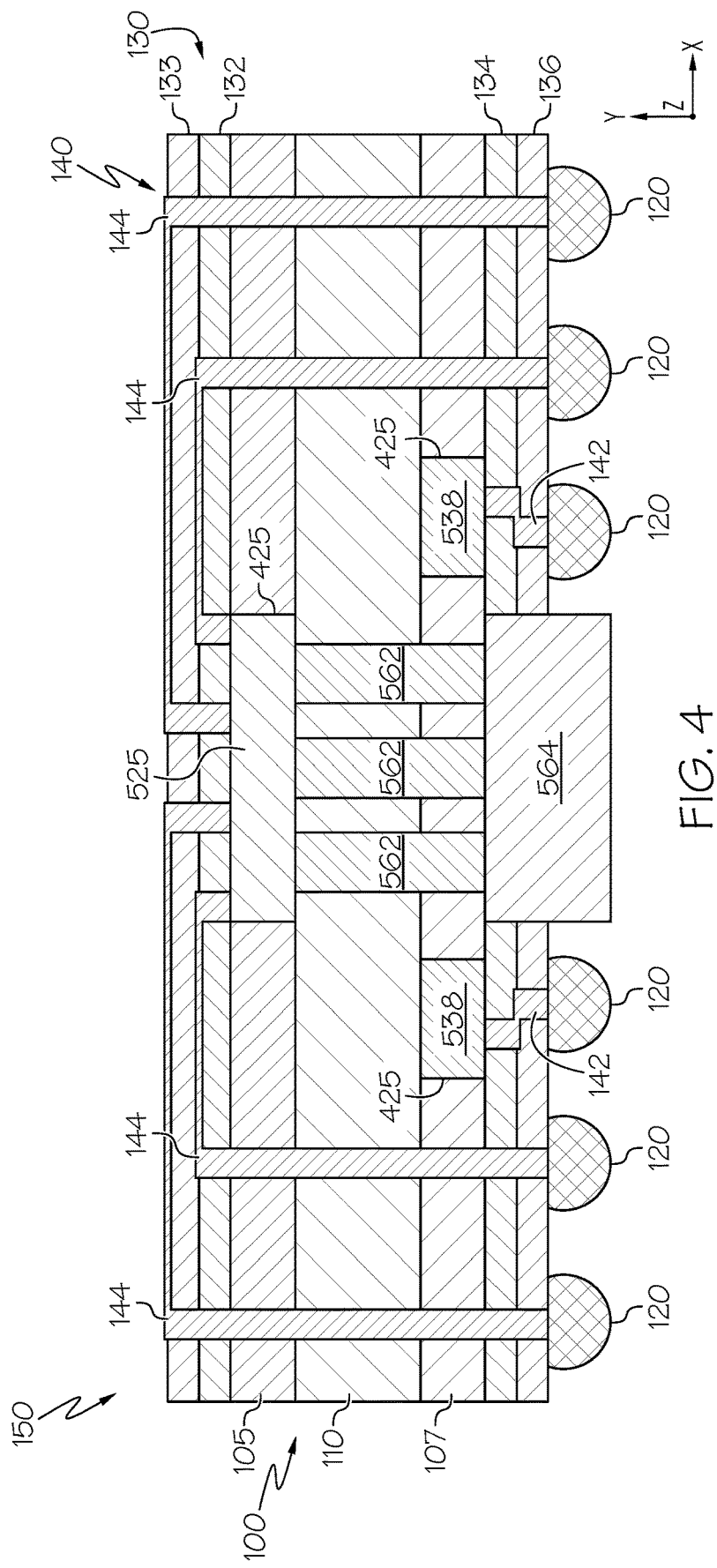
FIG. 4 schematically depicts a cross-section of another electronic package assembly including a microprocessor, multiple memory chips, and thermal vias thermally coupled to a heat spreader, according to one or more embodiments shown and described herein.

Referring to FIG. 4, another embodiment of the electronic package assembly 150 is depicted. In the embodiment depicted in FIG. 4, the electronic package assembly 150 includes thermal vias 562 that are thermally coupled to the microprocessor 525 and a heat spreader 564 positioned on the bottom of the electronic package assembly 150. The heat spreader 564 is positioned on the bottom of the electronic package assembly 150, and the thermal vias 562 extend upward through the glass substrate 100 between the microprocessor 525 and the heat spreader 564. The thermal vias 562 and the heat spreader 564 operate to dissipate heat from the microprocessor 525 to an ambient medium surrounding the electronic package assembly 150, and may assist in maintaining the microprocessor 525 within an acceptable operating temperature. The thermal vias 562 and the heat spreader 564 may be formed from any suitable material for transmitting thermal energy, such as copper, a copper alloy, or the like, and may be formed through any suitable process. As with the embodiments described above and depicted in FIGS. 1-3, by including the memory chips 538 and the microprocessor 525 within the same electronic package assembly 150, the distance between the memory chips 538 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 5:
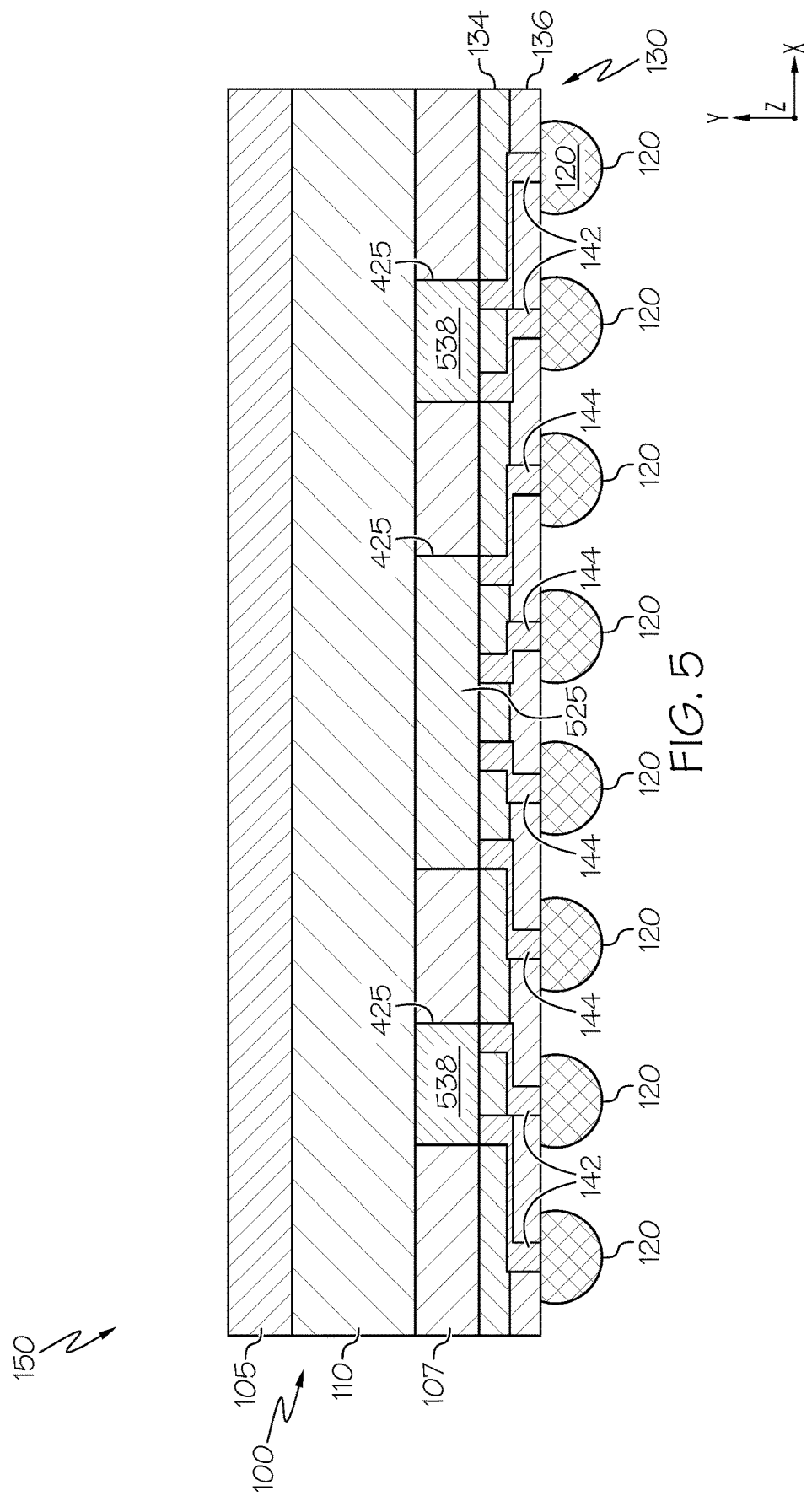
FIG. 5 schematically depicts a cross-section of another electronic package assembly including a microprocessor and multiple memory chips positioned in the same glass cladding layer, according to one or more embodiments shown and described herein.

Referring to FIG. 5, another embodiment of the electronic package assembly 150 is depicted. In the embodiment shown in FIG. 5, the microprocessor 525 and the memory chips 538 are each positioned within the lower glass cladding layer 107. While the glass substrate 100 in the embodiment depicted in FIG. 5 includes the glass central core 110, the upper glass cladding layer 105, and the lower glass cladding layer 107, it should be understood that the upper glass cladding layer 105 may be omitted. As with the embodiments described above and depicted in FIGS. 1-4, by including the memory chips 538 and the microprocessor 525 within the same electronic package assembly 150, the distance between the memory chips 538 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 6:
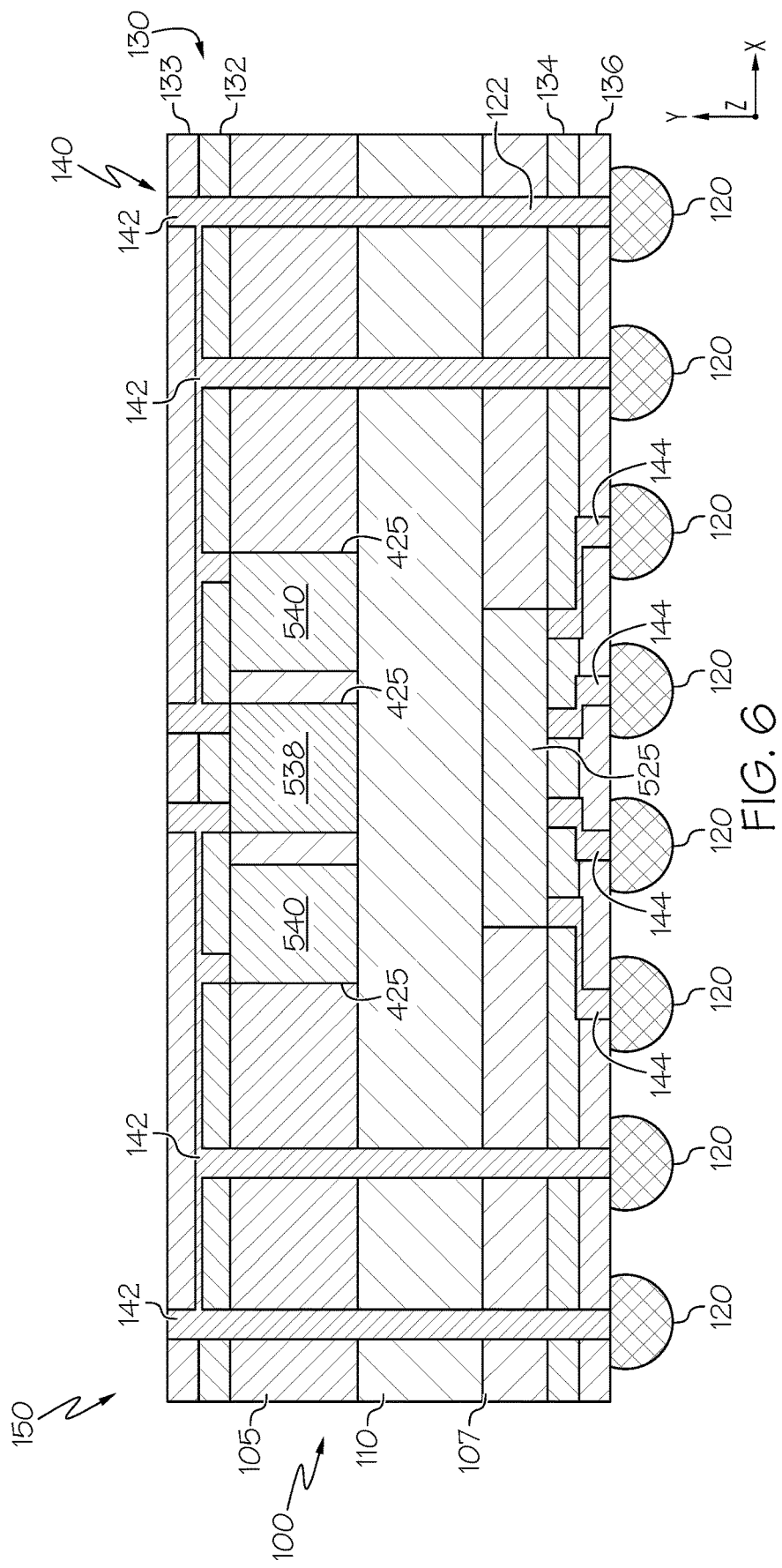
FIG. 6 schematically depicts a cross-section of another electronic package assembly including passive elements and a memory chip, according to one or more embodiments shown and described herein.

Referring to FIG. 6, another embodiment of the electronic package assembly 150 is depicted, in which the electronic package assembly 150 includes a passive element 540 in addition to the microprocessor 525 and the one or more memory chips 538. In particular, the electronic package assembly 150 includes a pair of passive elements 540 and the memory chip 538 positioned within cavities 425 in the upper glass cladding layer 105, and includes the microprocessor 525 is positioned within a cavity 425 of the lower glass cladding layer 107.

The passive elements 540 may generally include silicon based components that do not generate power, but instead dissipate, store, and/or release power, such as inductors, capacitors, resistors and the like, and may be made by a multilayer co-fired ceramic (MLCC) process, or the like. Passive elements 540 are generally comparatively thicker than microprocessors 525 (evaluated in the y-direction as depicted) and may have a thickness greater than 200 μm. Accordingly, in the embodiment depicted in FIG. 6, the upper glass cladding layer 105 may have a thickness selected to correspond to the thickness of the passive elements 540, while the lower glass cladding layer 107 has a comparatively smaller thickness selected to correspond to the thickness of the microprocessor 525, such that the glass substrate 100 has an asymmetric cross-section.

As with the embodiments described above and depicted in FIGS. 1-5, by including the passive elements 540, the memory chip 538, and the microprocessor 525 within the same electronic package assembly 150, the distance between the memory chips 538 and the microprocessor 525 as well as between the passive elements 540 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above. The passive elements 540 in the embodiment depicted in FIG. 6 may be utilized for noise suppression to sink unwanted frequencies in the electronic package assembly 150, which may further accentuate the benefit of minimizing signal and dielectric loss by utilizing the glass substrate 100.

Figure 7:
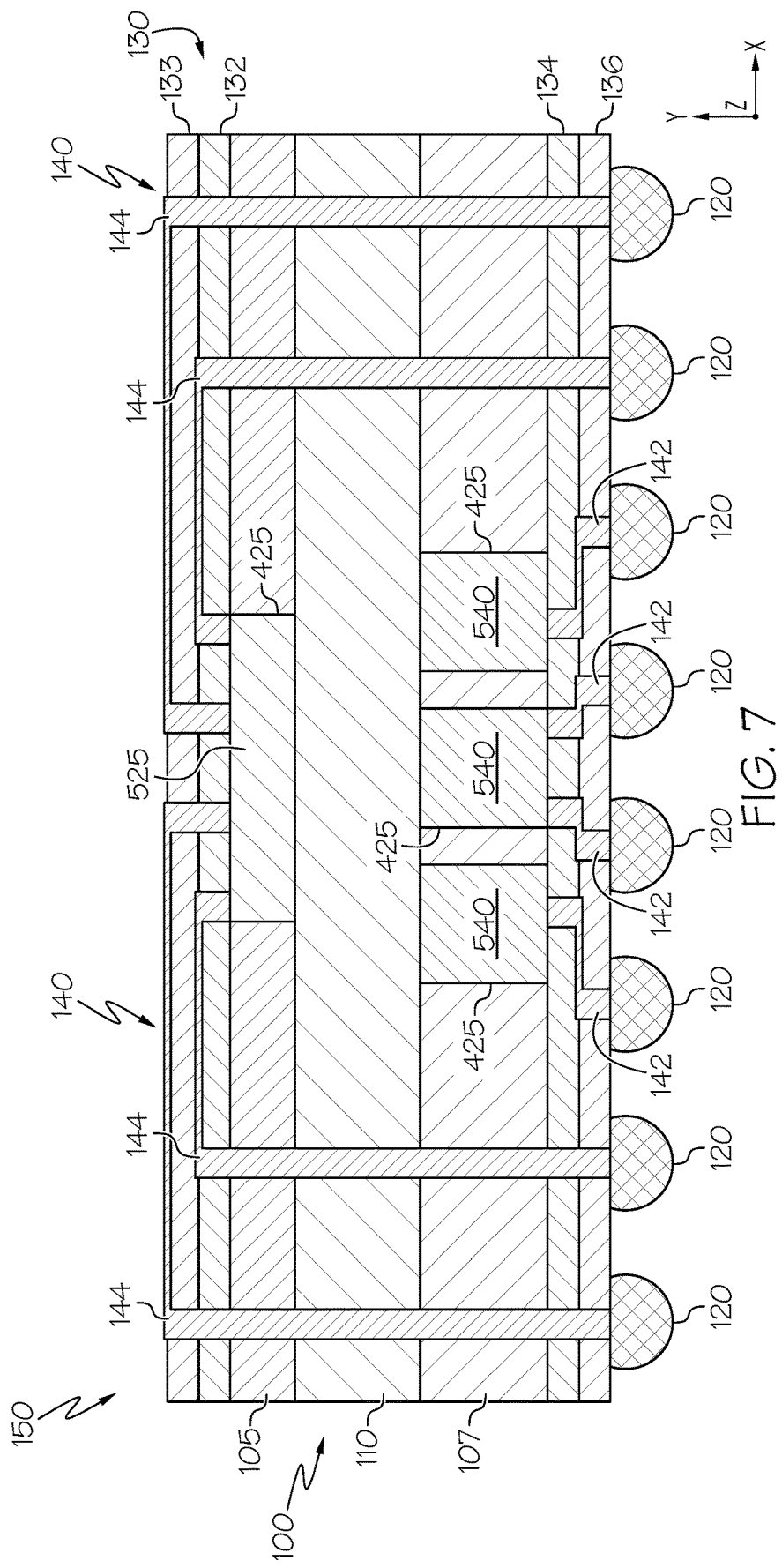
FIG. 7 schematically depicts a cross-section of another electronic package assembly including multiple passive elements, according to one or more embodiments shown and described herein.

Referring to FIG. 7, another embodiment of an electronic package assembly 150 is depicted. Like the embodiment described above and depicted in FIG. 6, the electronic package assembly 150 includes multiple passive elements 540 positioned within the glass substrate 100. In the embodiment depicted in FIG. 7, the passive elements 540 are positioned within cavities 425 in the lower glass cladding layer 107, while the microprocessor 525 is positioned within a cavity 425 of the upper glass cladding layer 105. As the passive elements 540 are positioned within the lower glass cladding layer 107, the passive elements 540 are positioned closer to the solder bumps 120, as compared to the microprocessor 525 positioned within the upper glass cladding layer 105. By positioning the passive elements 540 close to the solder bumps 120, the number of vias 142 required to connect the passive elements to the solder bumps 120 may be reduced, which may be particularly desirable when the electronic package assembly 150 includes multiple passive elements 540. Similar to the embodiment described above and depicted in FIGS. 7, by including the passive elements 540 and the microprocessor 525 within the same electronic package assembly 150, the distance between the passive elements 540 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 8:
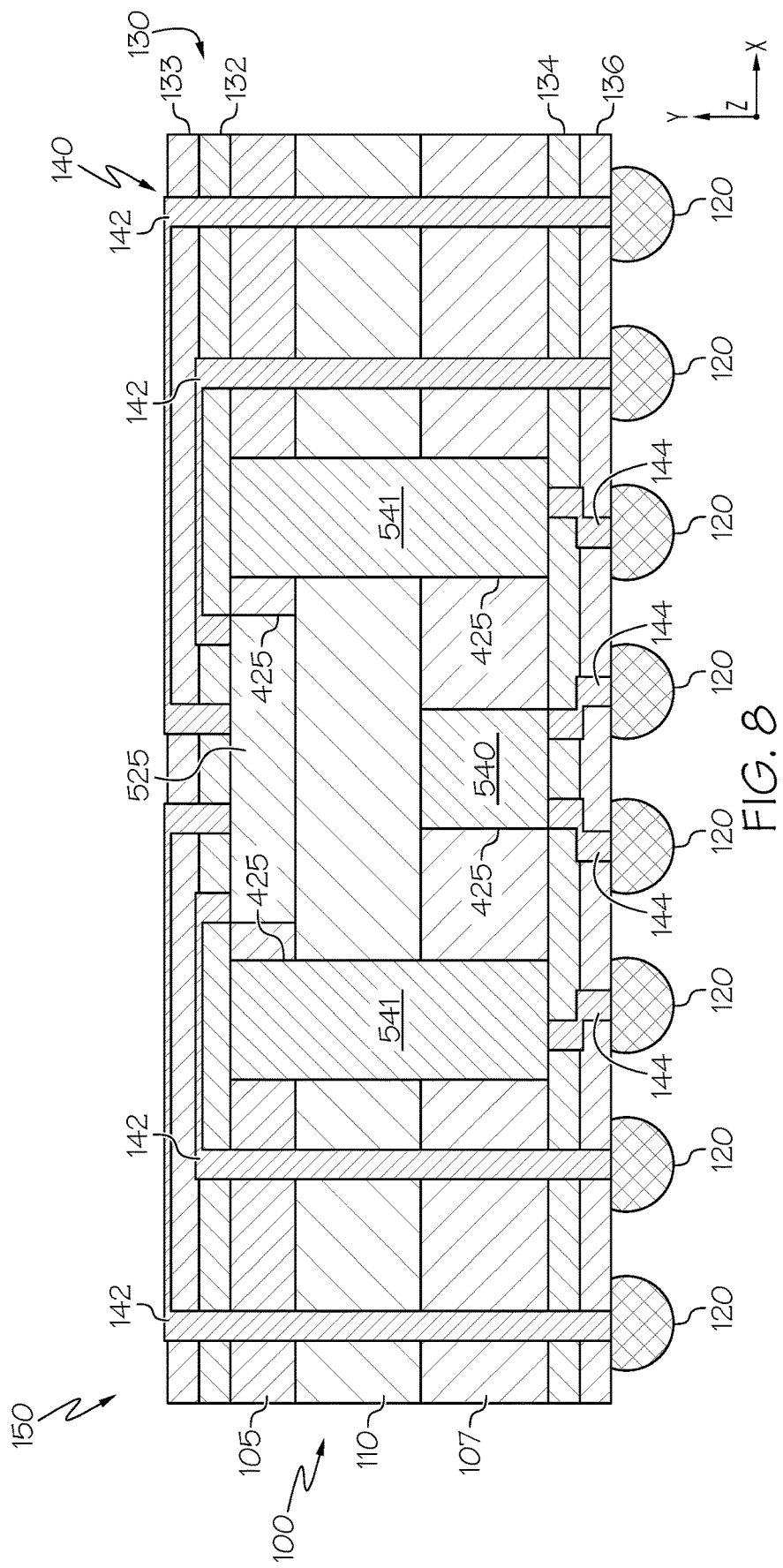
FIG. 8 schematically depicts a cross-section of another electronic package assembly including multiple passive elements, according to one or more embodiments shown and described herein.

Referring to FIG. 8, another embodiment of the electronic package assembly 150 including the passive element 540 is depicted. In the embodiment depicted in FIG. 8, the electronic package assembly 150 includes a pair of passive elements 541 that extend through the thickness of the glass substrate 100. Similar to the embodiments described above and depicted in FIGS. 6 and 7, by including the passive elements 540, 541 and the microprocessor 525 within the same electronic package assembly 150, the distance between the passive elements 540, 541 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above.

Figure 9:
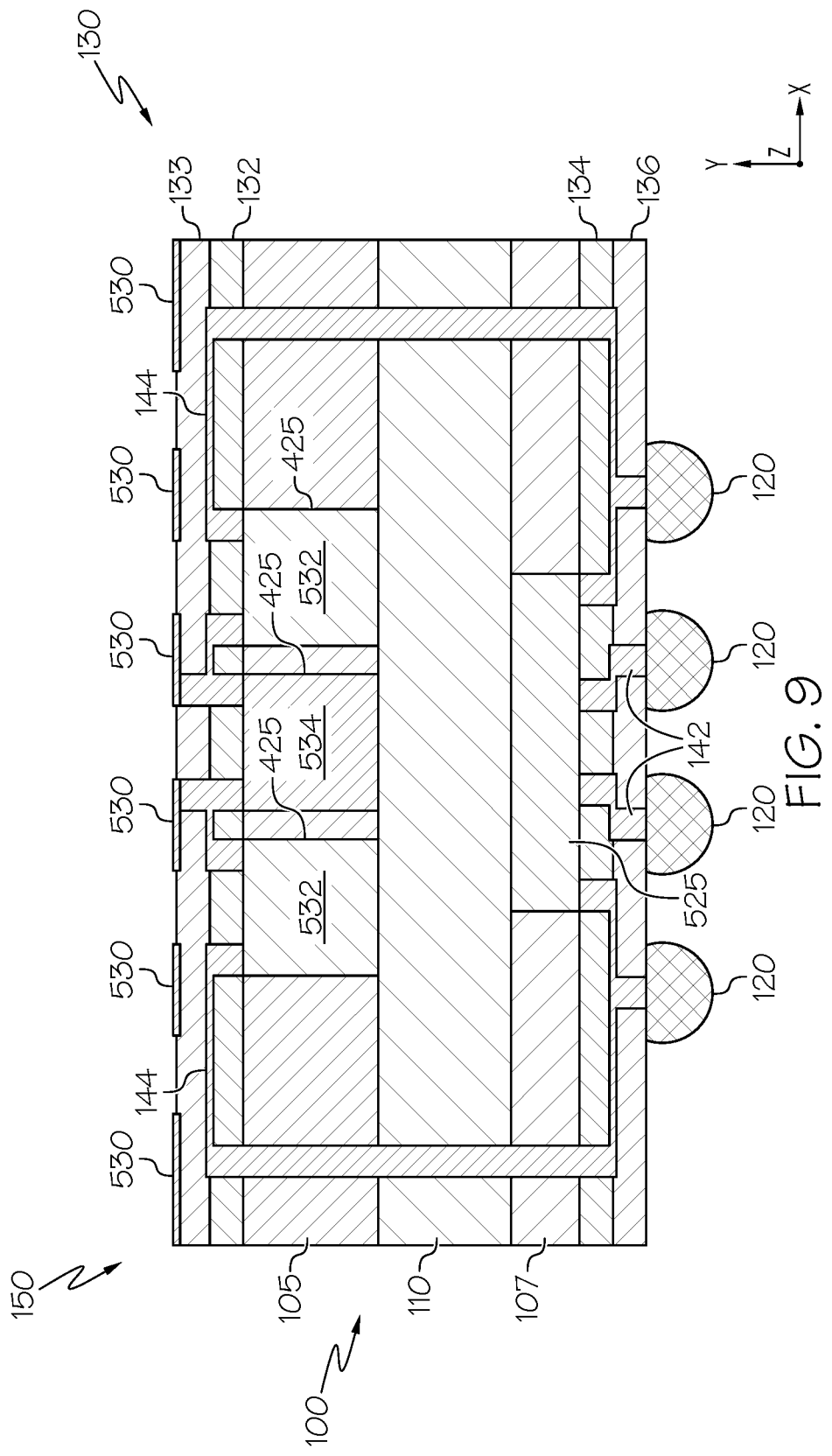
FIG. 9 schematically depicts a cross-section of another electronic package assembly including passive and analog RF devices, according to one or more embodiments shown and described herein.

Referring to FIG. 9, another embodiment of the electronic package assembly 150 is depicted. The electronic package assembly 150 includes the glass substrate 100 including the upper glass cladding layer 105, the glass central core 110, and the lower glass cladding layer 107, and has the microprocessor 525 positioned within a cavity 425 of the lower glass cladding layer 107. In the embodiment depicted in FIG. 9, the electronic package assembly 150 includes one or more RF devices. In particular, the electronic package assembly 150 includes one or more passive RF devices 530 positioned on the top of the electronic package assembly 150 (i.e., on the top of the upper polymer dielectric layer 133 as depicted). The passive RF devices 530 may generally include antennas, waveguides, baluns, or the like positioned on the electronic package assembly.

The electronic package assembly 150 further includes a pair of first analog RF devices 532 and a second analog RF device 534, each of which are positioned within respective cavities 425 within the upper glass cladding layer 105 of the glass substrate 100. In embodiments, the first analog RF devices 532 and the second analog RF device 534 are silicon-based structures, and one or more of the first analog RF devices 532 may be different from the second analog RF device 534. For example, in some embodiments, the first analog RF devices 532 may include amplifiers or the like, and the second analog RF device may include a switch, a multiplexer, or the like.

In general, the first and the second analog RF devices 532, 534 generally have a thickness that is greater than a thickness of the microprocessor 525 (evaluated in the y-direction as depicted). In some embodiments, the first and the second analog RF devices 532, 534 may have a thickness that is between about 200 μm and 300 μm, inclusive of the endpoints. Accordingly, in the embodiment depicted in FIG. 9, the upper glass cladding layer 105 may have a thickness selected to correspond to the thickness of the first and the second analog RF devices 532, 534, while the lower glass cladding layer 107 has a comparatively smaller thickness selected to correspond to the thickness of the microprocessor 525, such that the glass substrate 100 has an asymmetric cross-section.

Similar to the embodiments described above, by including the analog RF devices 532, 534, the passive RF devices 530, and the microprocessor 525 within the same electronic package assembly 150, the distance between the passive elements 540, 541 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above. Furthermore, the analog RF devices 532, 534, and the passive RF devices 530 may operate at a wide range of frequencies. For example, in some embodiments, the analog RF devices 532, 534, and the passive RF devices 530 may operate up to 100 GHz. As described above, the dielectric constant of polymer substrates may increase significantly at high frequencies, contributing to dielectric and signal loss at high frequencies, and at such high frequencies, polymer substrates may become unusable. Accordingly, by utilizing the glass substrate 100 to mount the analog RF devices 532, 534, and the passive RF devices 530, dielectric and signal loss can be minimized as compared to conventional configurations.

Figure 10:
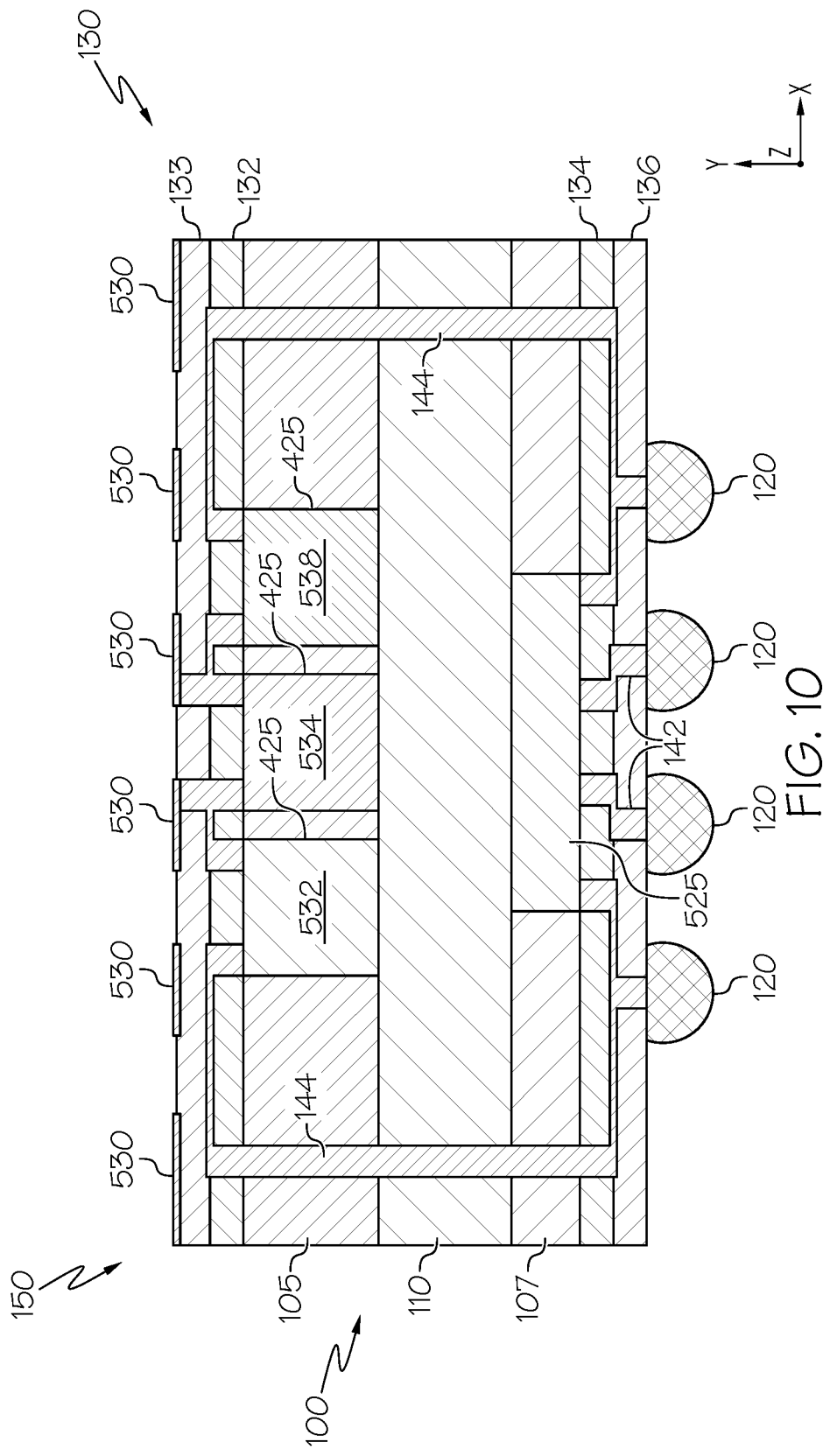
FIG. 10 schematically depicts a cross-section of another electronic package assembly including passive and analog RF devices and a memory chip, according to one or more embodiments shown and described herein.

Referring to FIG. 10, another embodiment of the electronic package assembly 150 is depicted. The electronic package assembly 150 includes the glass substrate 100, having the first and second analog RF devices 532, 534, along with the passive RF devices 530 positioned on the top of the electronic package assembly 150. In the embodiment depicted in FIG. 10, the electronic package assembly 150 further includes a memory chip 538 positioned within a cavity 425 of the upper glass cladding layer 105.

Similar to the embodiment shown in FIG. 9, by including the analog RF devices 532, 534, the passive RF devices 530, and the microprocessor 525 within the same electronic package assembly 150, the distance between the passive elements 540, 541 and the microprocessor 525 may be minimized, thereby reducing latency delays of the microprocessor 525 and minimizing the form factor of the electronic package assembly 150. Furthermore, by utilizing a glass substrate 100, dielectric loss and thermal stress may be minimized, as described above. Furthermore, the analog RF devices 532, 534, and the passive RF devices 530 may operate at a wide range of frequencies. For example, in some embodiments, the analog RF devices 532, 534, and the passive RF devices 530 may operate up to 100 GHz. As described above, the dielectric constant of polymer substrates may increase significantly at high frequencies, contributing to dielectric and signal loss at high frequencies, and at such high frequencies, polymer substrates may become unusable. Accordingly, by utilizing the glass substrate 100 to mount the analog RF devices 532, 534, and the passive RF devices 530, dielectric and signal loss can be minimized as compared to conventional configurations.

It should now be understood that electronic package assemblies 150 according to the present disclosure may include a number of electronic components, such as microprocessors, passive elements, as well as passive and active RF devices. As described above, by positioning the electronic components within a glass substrate, latency delays for the microprocessor and the form factor of the electronic package assembly may be minimized. Furthermore, as the glass substrate has a closer CTE to the electronic components than conventional polymer substrates, thermal stresses are reduced as compared to conventional configurations. Furthermore, dielectric loss and particularly dielectric loss at high frequency operating conditions, as may be experienced when RF devices are incorporated within the electronic package assembly may be minimized as compared to conventional configurations utilizing a polymer substrate.

To position and retain the electronic components within the cavities of the glass substrate, in particular without relying upon a polymer adhesive, it is desirable to form precisely dimensioned cavities to accept the electronic components. A process for forming precisely dimensioned cavities within the glass substrate is described below.

Figure 11:
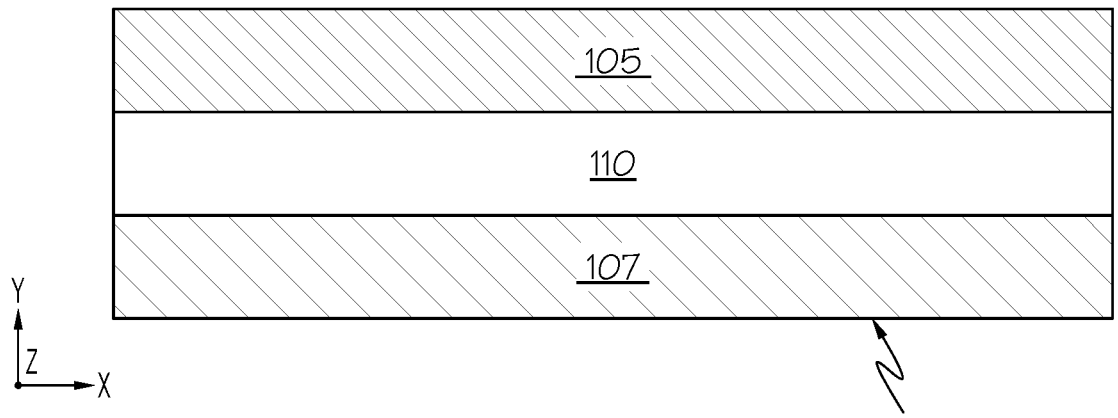
FIG. 11 schematically depicts a cross-section of a glass substrate, according to one or more embodiments shown and described herein.

Referring initially to FIG. 11, the glass substrate 100 is depicted, including the upper glass cladding layer 105, the lower glass cladding layer 107, and the glass central core 110. As described above, the glass compositions of the upper glass cladding layer 105, the lower glass cladding layer 107, and the glass central core 110 can vary such that the durability of the upper glass cladding layer 105, the lower glass cladding layer 107, and the glass central core 110 in an etchant varies. For example, it can be desirable for one or both of the upper glass cladding layer 105 and lower glass cladding layer 107 to have a dissolution rate in the etchant that is different than the glass central core 110.

Figure 12:
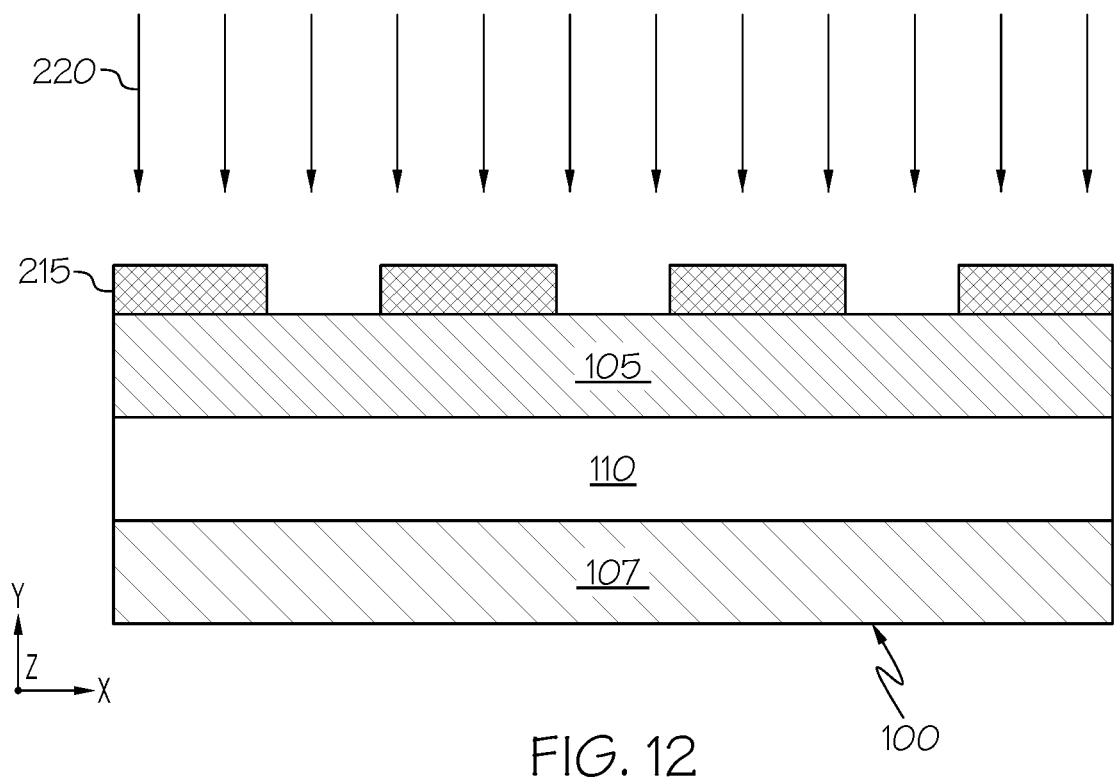
FIG. 12 schematically depicts the cross-section of the glass substrate of FIG. 11 being selectively exposed to an etchant through a mask to form cavities in a cladding layer, according to one or more embodiments shown and described herein.
Figure 13:
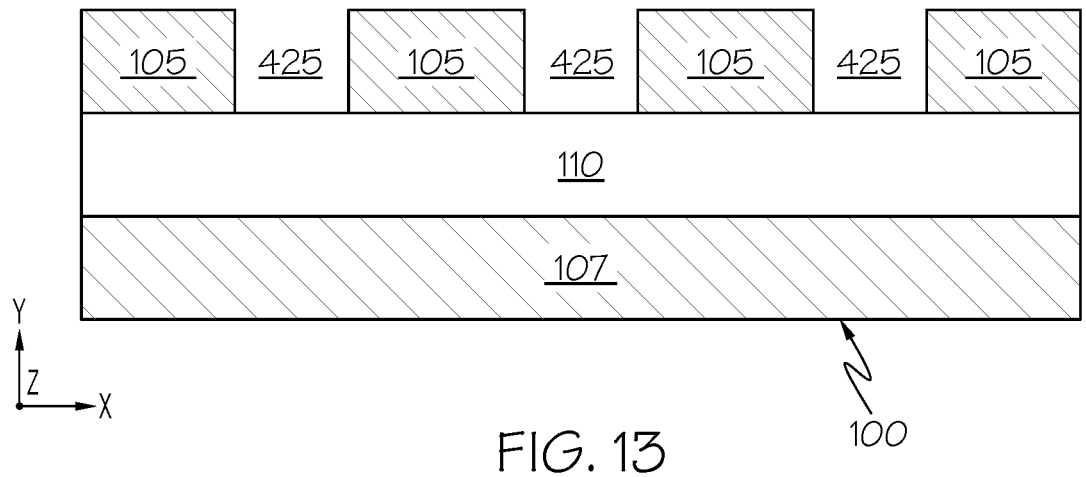
FIG. 13 schematically depicts a cross-section of the glass substrate of FIGS. 11 and 12 after forming cavities therein and removing the mask, according to one or more embodiments shown and described herein.

Referring collectively to FIGS. 12 and 13, cavities 425 are formed in the glass substrate 100 to transform the glass substrate into a structured article as described herein. The cavities 425 can be formed in the surface of the glass substrate 100 using the process depicted in FIG. 12. In some embodiments, the process comprises forming a mask 215 on a surface of the glass substrate 100. For example, the mask 215 is formed on the surface of the upper glass cladding layer 105 and/or the lower glass cladding layer 107. The mask 215 can be formed by printing (e.g., inkjet printing, gravure printing, screen printing, or another printing process) or another deposition process. In some embodiments, the mask 215 is resistant to the etchant (e.g., the etchant that will be used to etch the cavities 425 in the glass substrate 100). For example, the mask 215 can comprise an acrylic ester, a multifunctional acrylate n-vinylcaprolactam, or another suitable mask material. In some embodiments, the mask 215 is formed from an ink material comprising a primer to enhance adhesion between the mask and the glass substrate 100. Such enhanced adhesion can reduce seepage of the etchant between the mask 215 and the glass substrate 100, which can help to enable the precise cavities described herein.

In some embodiments, the mask 215 comprises one or more open regions at which the glass substrate 100 remains uncovered. The open regions of the mask 215 can have a pattern corresponding to the desired pattern of the cavities 425 to be formed in the glass substrate 100. For example, the pattern of the mask 215 can be an array of regularly repeating rectangular shapes (e.g., to receive microprocessors/electronic components as described herein). In such embodiments, the shapes patterned by the mask 215 can correspond closely to the shape of the microprocessors/electronic components. Other shapes also can be used, and the shapes can correspond closely to the shape of the electronic components or be capable of securely holding the electronic components in position on the glass substrate 100. Thus, the mask 215 can be configured as an etch mask to enable selective etching of the upper glass cladding layer 105 and/or the lower glass cladding layer 107 and form the cavities 425 in the glass substrate 100 as described herein.

In some embodiments, the glass substrate 100 with the mask 215 disposed thereon is exposed to the etchant 220. For example, the upper glass cladding layer 105 and/or the lower glass cladding layer 107 is contacted with the etchant 220 as shown in FIG. 12, thereby selectively etching an exposed portion of the respective glass cladding layer that is uncovered by the mask 215 and forming the cavities 425 in the glass substrate, thereby transforming the substrate into the shaped article. In some embodiments, the glass substrate 100 with the mask 215 disposed thereon is exposed to the etchant 220 at an etching temperature and for an etching time. For example, the etching temperature is about 20° C., about 22° C., about 25° C., about 30° C., about 35° C., about 40° C., about 45° C., or about 50° C., or any ranges defined by any combination of the stated values. A lower etching temperature can help to maintain the integrity of the mask 215 during the etching, which can enable an increased etching time and/or improved cavity shape as described herein. Additionally, or alternatively, the etching time can be about 10 minutes, about 15 minutes, about 20 minutes, about 25 minutes, about 30 minutes, about 35 minutes, about 40 minutes, about 45 minutes, about 50 minutes, about 55 minutes, about 60 minutes, about 65 minutes, about 70 minutes, about 75 minutes, about 80 minutes, about 85 minutes, or about 90 minutes, or any ranges defined by any combination of the stated values. A relatively long etching time can enable substantially straight sidewalls of the cavities 425 as described herein.

In some embodiments, the upper glass cladding layer 105 and/or the lower glass cladding layer 107 etch at least 1.5 times faster, at least 2 times faster, at least 5 times faster, at least 10 times faster, at least 20 times faster, or at least 100 times faster than the glass central core 110. Additionally, or alternatively, a ratio of the etch rate of the upper glass cladding layer 105 and/or the lower glass cladding layer 107 to the etch rate of the glass central core 110 is about 5, about 10, about 15, about 20, about 25, about 30, about 35, about 40, about 45, about 50, about 55, about 60, about 65, about 70, about 75, about 80, about 85, about 90, about 95, about 100, or any ranges defined by any combination of the stated values.

In some embodiments, the forming the cavities 425 comprises etching substantially entirely through the upper glass cladding layer 105 and/or the lower glass cladding layer 107 to expose a portion of the glass central core 110 at the bottom of the cavities. Thus, the sidewalls of the cavities 425 are defined by the upper glass cladding layer 105 and/or the lower glass cladding layer 107, and the floors of the cavities 425 are defined by the glass central core 110. In some embodiments, the glass central core 110 is not substantially etched during the forming the cavities 425. Thus, the glass central core 110 serves as an etch stop that determines the depth of the cavities 425.

While a wet etching process is described above, photomachining may also provide a suitable process for forming the cavities 425 within the upper glass cladding layer 105 and/or the lower glass cladding layer. For example, an energy source, such as a laser, a ultraviolet radiation source, or the like, may be exposed to portions of the glass substrate 100 and may form cracks and/or crystallize exposed portions of the glass substrate 100 that are photosensitive to the energy source. The crystallized/cracked portions of the glass substrate 100 may then have a comparatively high etch rate in an etchant, and may be removed by exposing the glass substrate to an etchant.

In these embodiments, the glass compositions of the upper glass cladding layer 105, the lower glass cladding layer 107, and the glass central core layer 110 can vary such that the photosensitivity of the upper glass cladding layer 105 and the lower glass cladding layer 107 is different from the glass central core 110. For example, it can be desirable for the glass central core 110 to have a lower photosensitivity than the upper glass cladding layer 105 and the lower glass cladding layer 107. The different photosensitivities between the glass central core 110 and the upper and lower glass cladding layers 105, 107 may assist in the formation of the cavities 425 in the surface of the glass substrate 100. For example, the upper and lower glass cladding layers 105, 107 can be sufficiently photosensitive that they can be photomachined to form the cavities 425. On the other hand, the glass central core 110 can be sufficiently non-photosensitive that it is not susceptible to being photomachined.

In some embodiments, the floor of the one or more cavities is of optical quality. For example, a surface roughness of the floor of the cavities 425 is at most about 50 nm, at most about 40 nm, at most about 30 nm, at most about 20 nm, at most about 10 nm, at most about 9 nm, at most about 8 nm, at most about 7 nm, at most about 6 nm, or at most about 5 nm. Such low surface roughness can be enabled by the etch stop provided by the glass central core 110 and/or agitating the etchant during the etching to remove etching byproducts from the cavity. Additionally, or alternatively, such low surface roughness can enable light to pass through the floor (e.g., for optical activation and/or analysis of an object or material disposed within the cavities) without substantial distortion.

In some embodiments, the floor of the one or more cavities is substantially flat. For example, a difference between a first depth of the cavity at a first position along the perimeter of the cavity and a second depth of the cavity at a second position along the perimeter of the cavity opposite the first position (e.g., diametrically opposed) is at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, or at most about 0.1 µm. Such a low depth difference can be enabled by the etch stop provided by the glass central core 110. For example, the depth of the cavity can be determined primarily by the thickness of the upper glass cladding layer 105 and/or the lower glass cladding layer 107 without changing substantially as a result of changes in etch temperature and/or etch time.

In some embodiments, the sidewalls 305 of the cavities 425 are substantially vertical (e.g., the sidewalls are substantially perpendicular to the floor 310 of the cavity 425). For example, an angle formed between the sidewall 305 and the floor 310 of the cavity 425 is approximately 90°, or from about 80° to about 100°. Additionally, or alternatively, a difference between a width of the cavity at a top of the cavity (e.g., near the surface of the glass substrate) and a width of the cavity at a bottom of the cavity (e.g., near the floor of the cavity) is at most about 1 mm, at most about 0.9 mm, at most about 0.8 mm, at most about 0.7 mm, at most about 0.6 mm, or at most about 0.5 mm. In some of such embodiments, the depth of the cavity is at least about 50 µm, at least about 60 µm, at least about 70 µm, at least about 80 µm, or at least about 90 µm . Such a low angle of the sidewalls can be enabled by an increased etching time, which can be enabled by the etch stop provided by the glass core layer 110. For example, the etching time can be extended to remove material at the intersection between the sidewalls and the floor near the bottom of the cavity without substantially increasing the depth of the cavity. Removing such material can result in a straighter (e.g., vertical) sidewall compared to conventional wet etching processes.

In some embodiments, following the forming the cavities 425, the mask 215 is removed from the glass substrate 100. For example, the removing the mask 215 comprises contacting the mask with a solvent, thereby removing the mask from the surface of the glass substrate. In some embodiments, the solvent is water. For example, the removing the mask 215 comprises submerging the glass substrate 100 with the mask 215 disposed thereon into water, thereby removing the mask from the surface of the glass substrate.

Figure 14:
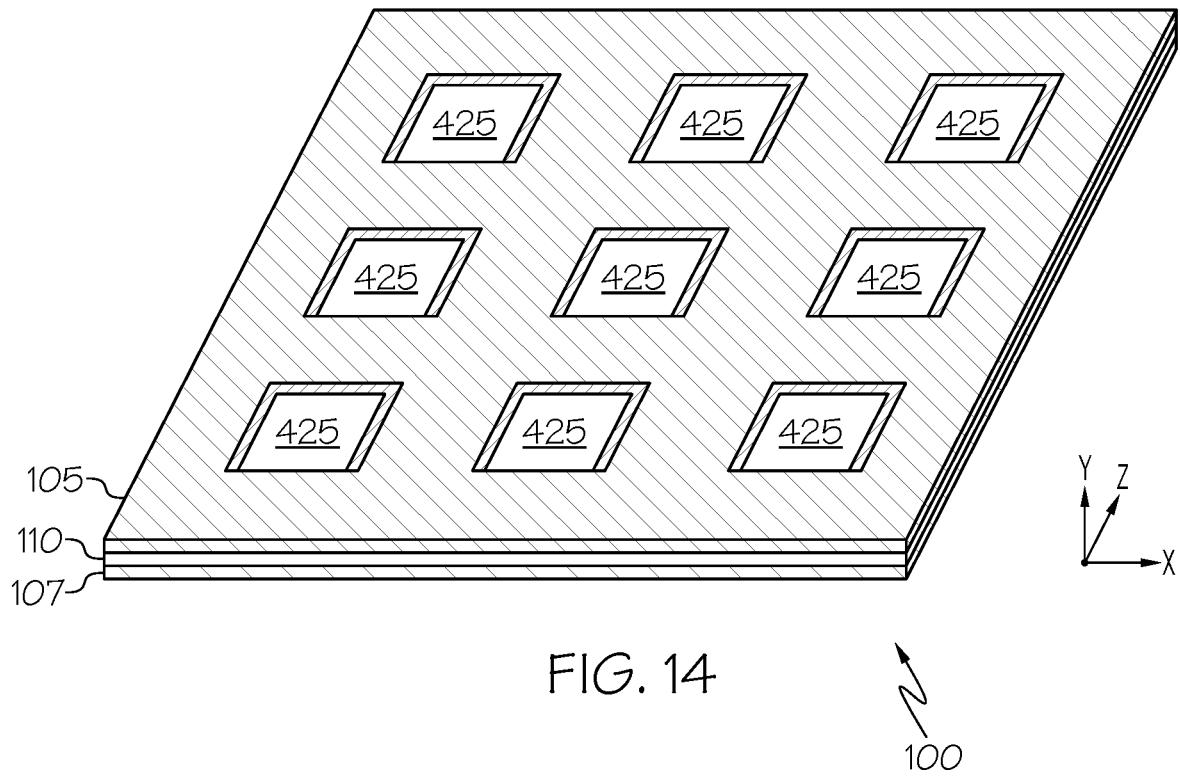
FIG. 14 schematically depicts a perspective view of the glass substrate of FIGS. 11 and 12 after forming cavities therein and removing the mask, according to one or more embodiments shown and described herein.

Referring now to FIGS. 13-14, cross-sectional schematic and perspective views are depicted, respectively, of the glass substrate 100 with the cavities 425 formed therein and the mask 215 removed therefrom.

One advantage of the cavities 425 is that they can be formed with precision that is generally unattainable using conventional processing techniques. The depth of the cavities 425 is especially precise in those embodiments where the glass central core 110 is unaffected by the etching process. In such embodiments, the upper glass cladding layer 105 and/or the lower glass cladding layer 107 can be etched away until the glass central core 110 is exposed at the bottom of the cavities 425. Thus, the sides of the cavities 425 are defined by the upper glass cladding layer 105 and/or the lower glass cladding layer 107, and the floor is defined by the glass central core 110. This gives the cavities 425 a precise depth.

The cavities 425 shown in FIGS. 13-14 have a rectangular shape that corresponds to the microprocessor 525. It should be appreciated, however, that the cavities 425 can have any suitable shape. For example, the cavities 425 can have a square shape, a circular shape, or any other polygonal or non-polygonal shape.

Figure 15:
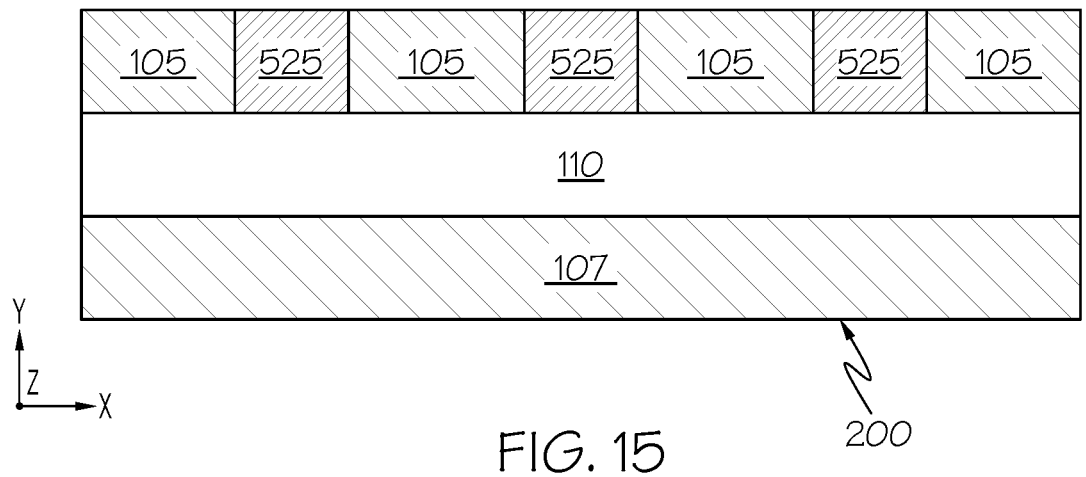
FIG. 15 schematically depicts a cross-section of a reconstituted wafer- and/or panel-level package, according to one or more embodiments shown and described herein.
Figure 16:
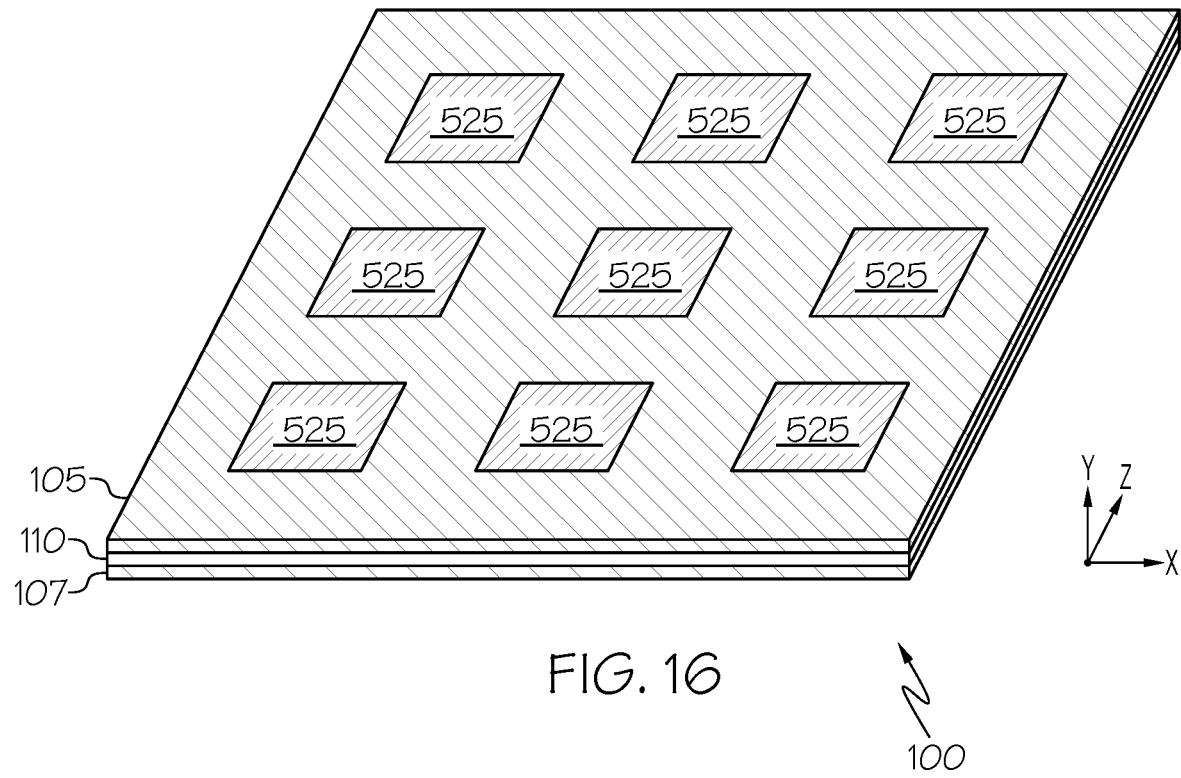
FIG. 16 schematically depicts a perspective view of the reconstituted wafer- and/or panel-level package of FIG. 15, according to one or more embodiments shown and described herein.

Referring collectively to FIGS. 15 and 16, in some embodiments, electronic components can be assembled to the shaped glass article. For example, microprocessor 525, which can be diced from an underlying wafer, are placed in the cavities 425. For the purpose of illustrating the insertion of electronic components within the cavities 425, reference is made to the microprocessor 525, however it should be understood that the cavities 425 can also be shaped to accept any of the memory chips 538 (FIG. 1), the passive elements 540 (FIG. 6), and/or the first and second active analog RF devices 532, 534 (FIG. 9) utilizing the same process. Furthermore, while the process depicted in FIGS. 12-16 shows the application of the mask 215 to the upper glass cladding layer 105 and the etching of the cavities 425 within the upper glass cladding layer 105, it should be understood that a similar process may be applied to the lower glass cladding layer 107 to form the cavities 425 within the lower glass cladding layer 107.

The cavities 425 are each substantially the same size (width (x), length (y), and/or depth (z)) as the microprocessor 525 to allow an exact fit of the microprocessor 525 in each corresponding cavity 425. As mentioned above, it can be desirable for the microprocessor 525 to be flush with the top surface of the upper glass cladding layer 105 and/or the lower glass cladding layer 107. Nevertheless, there may be situations where the top of the microprocessor 525 may not be perfectly flush with the upper glass cladding layer 105 and/or the lower glass cladding layer 107. This may be acceptable provided the resulting reconstituted substrate is capable of being further processed to produce the final package.

The microprocessor 525, the memory chips 538 (FIG. 1), the passive elements 540 (FIG. 6), and/or the first and second active analog RF devices 532, 534 (FIG. 9) can generally vary 1-2 microns in size. In some embodiments, the width (x), length (y), and/or depth (z) of each cavity 425 varies by no more than 20 microns, no more than 10 microns, no more than 5 microns, or no more than 4 microns relative to: (a) a target size of the dimension(s) of the cavities 425, (b) the actual size of the corresponding dimension(s) of the microprocessor 525, the memory chips 538 (FIG. 1), the passive elements 540 (FIG. 6), and/or the first and second active analog RF devices 532, 534 (FIG. 9), and/or (c) the target size of the corresponding dimension(s) of the microprocessor 525, the memory chips 538 (FIG. 1), the passive elements 540 (FIG. 6), and/or the first and second active analog RF devices 532, 534 (FIG. 9). For example, the width (x), length (y), and/or depth (z) of each cavity 425 can be no more than 20 microns larger, no more than 10 microns larger, no more than 5 microns larger, or no more than 4 microns larger than: (a) a target size of the dimension(s) of the cavities 425, (b) the actual size of the corresponding dimension(s) of the microprocessor 525, the memory chips 538 (FIG. 1), the passive elements 540 (FIG. 6), and/or the first and second active analog RF devices 532, 534 (FIG. 9), and/or (c) the target size of the corresponding dimension(s) of the microprocessor 525, the memory chips 538 (FIG. 1), the passive elements 540 (FIG. 6), and/or the first and second active analog RF devices 532, 534 (FIG. 9). The laminate structure of the glass substrate 100 can provide particularly precise control of the depth of the cavities 425 compared to conventional substrates.

Accordingly, it should now be understood that by utilizing cladding layers having different etch rates than a central glass core, precise cavities can be formed in a glass substrate, which can then be utilized to form an electronic package assembly.

Terminology and Interpretative Norms

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood. Likewise, the term "glass structure" encompasses structures comprising glass. The term "reconstituted wafer- and/or panel-level package" encompasses any size of reconstituted substrate package including wafer level packages and panel level packages.

The term "surface roughness" means Ra surface roughness determined as described in ISO 25178, Geometric Product Specifications (GPS)—Surface texture: areal, filtered at 25 μm unless otherwise indicated. The surface roughness values reported herein were obtained using a Keyence confocal microscope.

The term "formed from" can mean one or more of comprises, consists essentially of, or consists of. For example, a component that is formed from a particular material can comprise the particular material, consist essentially of the particular material, or consist of the particular material.

Spatial or directional terms, such as "left," "right," "front," "back," and the like, relate to the subject matter as it is shown in the drawings. However, it is to be understood that the described subject matter may assume various alternative orientations and, accordingly, such terms are not to be considered as limiting.

Articles such as "the," "a," and "an" can connote the singular or plural. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

INCORPORATION BY REFERENCE

The entire contents of each of the documents listed below are incorporated by reference into this document. If the same term is used in both this document and one or more of the incorporated documents, then it should be interpreted to have the broadest meaning imparted by any one or combination of these sources unless the term has been explicitly defined to have a different meaning in this document. If there is an inconsistency between any of the following documents and this document, then this document shall govern. The incorporated subject matter should not be used to limit or narrow the scope of the explicitly recited or depicted subject matter.

U.S. Pat. No. 9,340,451 (application Ser. No. 13/798,479), titled "Machining of Fusion-Drawn Glass Laminate Structures Containing a Photomachinable Layer," filed on 13 Mar. 2013, issued on 17 May 2016 (the '451 patent);

U.S. Pat. App. Pub. No. 2017/0073266 (application Ser. No. 15/125,453), titled "Glass Article and Method for Forming the Same," filed on 12 Mar. 2015, published on 16 Mar. 2017 (the '266 application).

EXAMPLES

Various embodiments will be further clarified by the following examples.

A plurality of core glass compositions, which can be suitable for use as a core glass layer of a structured article, were prepared according to the batch compositions listed in Table 1 below. Batches of the oxide constituent components were mixed, melted, and formed into glass plates. The properties of the glass melt and the resultant structured article were measured and the results are reported in Table 2. The etch rates reported in Table 2 are expressed in terms of weight loss relative to the original weight of the sample after contact by a 50 vol % aqueous HCl solution at 60° C. in an ultrasonic bath for 30 min.

TABLE 1

Exemplary Core Glass Compositions

| Sample | SiO2 (mol %) | Al$_2$O$_3$ (mol %) | B$_2$O$_3$ (mol %) | Na$_2$O (mol %) | K$_2$O (mol %) | MgO (mol %) | CaO (mol %) | SnO$_2$ (mol %) |
|---|---|---|---|---|---|---|---|---|
| 1-1 | 66 | 10.26 | 0.58 | 14.23 | 2.37 | 5.75 | 0.59 | 0.21 |
| 1-2 | 69.18 | 8.47 | 0 | 13.92 | 1.16 | 6.54 | 0.53 | 0.19 |
| 1-3 | 68.84 | 10.63 | 0 | 14.86 | 0.02 | 5.43 | 0.04 | 0.17 |
| 1-4 | 67.45 | 12.69 | 3.67 | 13.67 | 0.02 | 2.36 | 0.03 | 0.09 |

TABLE 2

Properties of Exemplary Core Glass Compositions

| Sample | Etch Rate (%) | CTE ($\times 10^{-7}$/° C.) | Liquidus Temp (° C.) | Liquidus Visc (kP) | Strain Pt (° C.) | Anneal Pt (° C.) | Soft Pt (° C.) | Density (g/cm$^3$) |
|---|---|---|---|---|---|---|---|---|
| 1-1 | 0.01 | 91.1 | 900 | 4250 | 551 | 600 | 843 | 2.452 |
| 1-2 | 0.01 | 83.6 | 950 | 1498 | 560 | 609 | 844 | 2.444 |
| 1-3 | 0 | 80.1 | 1070 | nm | 602 | 652 | 900 | 2.432 |
| 1-4 | 0 | 74.6 | 1002 | 2210 | 589 | 644 | 922 | 2.403 |

A plurality of clad glass compositions, which can be suitable for use as a glass cladding layer of a structured article, were prepared according to the batch compositions listed in Table 3 below. Batches of the oxide constituent components were mixed, melted, and formed into glass plates. The properties of the glass melt and the resultant structured article were measured and the results are reported in Table 4. The etch rates reported in Table 4 are expressed in terms of weight loss relative to the original weight of the sample after contact by a 50 vol % aqueous HCl solution at 60° C. in an ultrasonic bath for 30 min.

TABLE 3

Exemplary Clad Glass Compositions

| Sample | SiO$_2$ (mol %) | Al$_2$O$_3$ (mol %) | B$_2$O$_3$ (mol %) | CaO (mol %) | Li$_2$O (mol %) | Na$_2$O (mol %) | K$_2$O (mol %) | SnO$_2$ (mol %) | ZrO$_2$ (mol %) | P$_2$O$_5$ (mol %) |
|---|---|---|---|---|---|---|---|---|---|---|
| 2-1 | 57 | 18.8 | 5 | 0 | 0 | 18.7 | 0.5 | 0.1 | 0.02 | 0 |
| 2-2 | 55 | 18.8 | 7 | 0 | 0 | 18.7 | 0.5 | 0.1 | 0.02 | 0 |
| 2-3 | 53 | 18.8 | 9 | 0 | 0 | 18.7 | 0.5 | 0.1 | 0.02 | 0 |
| 2-4 | 51 | 18.8 | 11 | 0 | 0 | 18.7 | 0.5 | 0.1 | 0.02 | 0 |
| 2-5 | 49 | 18.8 | 13 | 0 | 0 | 18.7 | 0.5 | 0.1 | 0.02 | 0 |
| 2-6 | 57 | 18.8 | 5 | 0 | 2 | 16.7 | 0.5 | 0.1 | 0.02 | 0 |
| 2-7 | 57 | 18.8 | 5 | 0 | 4 | 14.7 | 0.5 | 0.1 | 0.02 | 0 |
| 2-8 | 57 | 18.8 | 5 | 0 | 8 | 10.7 | 0.5 | 0.1 | 0.02 | 0 |
| 2-9 | 57 | 18 | 7 | 0 | 0 | 18 | 0 | 0.1 | 0 | 0 |
| 2-10 | 57 | 17 | 9 | 0 | 0 | 17 | 0 | 0.1 | 0 | 0 |
| 2-11 | 57 | 16 | 11 | 0 | 0 | 16 | 0 | 0.1 | 0 | 0 |
| 2-12 | 57 | 15 | 13 | 0 | 0 | 15 | 0 | 0.1 | 0 | 0 |
| 2-13 | 57.13 | 13.96 | 15.16 | 0.02 | 0 | 13.63 | 0 | 0.09 | 0 | 0 |
| 2-14 | 57 | 13 | 17 | 0 | 0 | 13 | 0 | 0.1 | 0 | 0 |
| 2-15 | 57.9 | 15 | 10 | 2 | 0 | 15 | 0 | 0.1 | 0 | 0 |
| 2-16 | 57.9 | 15 | 10 | 2 | 0 | 12 | 3 | 0.1 | 0 | 0 |
| 2-17 | 57.9 | 15 | 10 | 2 | 0 | 9 | 6 | 0.1 | 0 | 0 |
| 2-18 | 57.9 | 15 | 10 | 2 | 0 | 6 | 9 | 0.1 | 0 | 0 |
| 2-19 | 57.9 | 15 | 10 | 2 | 0 | 3 | 12 | 0.1 | 0 | 0 |
| 2-20 | 55 | 15 | 13 | 2 | 0 | 6 | 9 | 0.1 | 0 | 0 |
| 2-21 | 55 | 15 | 13 | 2 | 0 | 9 | 6 | 0.1 | 0 | 0 |
| 2-22 | 55 | 15 | 13 | 2 | 0 | 12 | 3 | 0.1 | 0 | 0 |
| 2-23 | 55 | 15 | 13 | 2 | 0 | 15 | 0 | 0.1 | 0 | 0 |
| 2-24 | 53 | 15 | 15 | 2 | 0 | 6 | 9 | 0.1 | 0 | 0 |
| 2-25 | 53 | 15 | 15 | 2 | 0 | 9 | 6 | 0.1 | 0 | 0 |
| 2-26 | 53 | 15 | 15 | 2 | 0 | 12 | 3 | 0.1 | 0 | 0 |
| 2-27 | 53 | 15 | 15 | 2 | 0 | 15 | 0 | 0.1 | 0 | 0 |
| 2-28 | 51 | 15 | 17 | 2 | 0 | 6 | 9 | 0.1 | 0 | 0 |
| 2-29 | 51 | 15 | 17 | 2 | 0 | 9 | 6 | 0.1 | 0 | 0 |
| 2-30 | 51 | 15 | 17 | 2 | 0 | 12 | 3 | 0.1 | 0 | 0 |
| 2-31 | 51 | 15 | 17 | 2 | 0 | 15 | 0 | 0.1 | 0 | 0 |
| 2-32 | 56 | 16 | 11 | 2 | 0 | 16 | 0 | 0.07 | 0 | 0 |
| 2-33 | 56 | 16 | 11 | 4 | 0 | 16 | 0 | 0.07 | 0 | 0 |
| 2-34 | 56 | 18 | 7 | 1 | 0 | 18 | 0 | 0.07 | 0 | 0 |
| 2-35 | 56 | 18 | 7 | 2 | 0 | 18 | 0 | 0.07 | 0 | 0 |
| 2-36 | 56 | 18 | 7 | 4 | 0 | 18 | 0 | 0.07 | 0 | 0 |

TABLE 3-continued

Exemplary Clad Glass Compositions

| Sample | SiO$_2$ (mol %) | Al$_2$O$_3$ (mol %) | B$_2$O$_3$ (mol %) | CaO (mol %) | Li$_2$O (mol %) | Na$_2$O (mol %) | K$_2$O (mol %) | SnO$_2$ (mol %) | ZrO$_2$ (mol %) | P$_2$O$_5$ (mol %) |
|---|---|---|---|---|---|---|---|---|---|---|
| 2-37 | 55 | 17 | 11 | 0 | 0 | 17 | 0 | 0.07 | 0 | 0 |
| 2-38 | 54 | 17.5 | 11 | 0 | 0 | 17.5 | 0 | 0.07 | 0 | 0 |
| 2-39 | 53 | 18 | 11 | 0 | 0 | 18 | 0 | 0.07 | 0 | 0 |
| 2-40 | 55 | 16 | 13 | 0 | 0 | 16 | 0 | 0.07 | 0 | 0 |
| 2-41 | 54 | 16 | 14 | 0 | 0 | 16 | 0 | 0.07 | 0 | 0 |
| 2-42 | 53 | 16 | 15 | 0 | 0 | 16 | 0 | 0.07 | 0 | 0 |
| 2-43 | 57 | 17.5 | 7 | 0 | 0 | 18.5 | 0 | 0.1 | 0 | 0 |
| 2-44 | 57 | 17 | 7 | 0 | 0 | 19 | 0 | 0.1 | 0 | 0 |
| 2-45 | 57 | 16.5 | 7 | 0 | 0 | 19.5 | 0 | 0.1 | 0 | 0 |
| 2-46 | 57 | 16 | 7 | 0 | 0 | 20 | 0 | 0.1 | 0 | 0 |
| 2-47 | 57 | 15.5 | 7 | 0 | 0 | 20.5 | 0 | 0.1 | 0 | 0 |
| 2-48 | 57 | 15 | 7 | 0 | 0 | 21 | 0 | 0.1 | 0 | 0 |
| 2-49 | 49 | 15 | 19 | 2 | 0 | 15 | 0 | 0.1 | 0 | 0 |
| 2-50 | 47 | 15 | 21 | 2 | 0 | 15 | 0 | 0.1 | 0 | 0 |
| 2-51 | 45 | 15 | 23 | 2 | 0 | 15 | 0 | 0.1 | 0 | 0 |
| 2-52 | 57 | 16 | 11 | 10 | 0 | 16 | 0 | 0.1 | 0 | 0 |
| 2-53 | 57 | 14.5 | 14 | 0 | 0 | 14.5 | 0 | 0 | 0 | 0 |
| 2-54 | 57 | 15 | 13 | 2 | 0 | 15 | 0 | 0 | 0 | 0 |
| 2-55 | 57 | 14.5 | 14 | 2 | 0 | 14.5 | 0 | 0 | 0 | 0 |
| 2-56 | 57 | 14 | 15 | 2 | 0 | 14 | 0 | 0 | 0 | 0 |
| 2-57 | 57 | 17.5 | 7 | 1 | 0 | 18.5 | 0 | 0.1 | 0 | 0 |
| 2-58 | 57 | 17.5 | 7 | 2 | 0 | 18.5 | 0 | 0.1 | 0 | 0 |
| 2-59 | 57 | 17.5 | 7 | 0 | 0 | 19.5 | 0 | 0.1 | 0 | 0 |
| 2-60 | 57 | 17.5 | 7 | 0 | 0 | 18.5 | 0 | 0.1 | 0 | 3 |
| 2-61 | 57 | 17.5 | 7 | 0 | 0 | 18.5 | 0 | 0.1 | 0 | 6 |
| 2-62 | 53 | 14.5 | 17 | 1 | 0 | 14.5 | 0 | 0.1 | 0 | 0 |
| 2-63 | 51 | 14.75 | 18 | 1.5 | 0 | 14.75 | 0 | 0.1 | 0 | 0 |
| 2-64 | 57 | 18.8 | 5 | 0 | 0 | 18.7 | 0.5 | 0.1 | 0.2 | 0 |
| 2-65 | 57 | 18 | 7 | 10 | 0 | 18 | 0 | 0.1 | 0 | 0 |
| 2-66 | 57 | 17 | 9 | 10 | 0 | 17 | 0 | 0.1 | 0 | 0 |
| 2-67 | 57 | 17.5 | 7 | 4 | 0 | 18.5 | 0 | 0.1 | 0 | 0 |
| 2-68 | 60 | 15.38 | 0 | 0 | 0 | 16.49 | 0 | 0.1 | 0 | 5.15 |

TABLE 4

Properties of Exemplary Clad Glass Compositions

| Sample | Etch Rate (%) | CTE (× 10$^{-7}$/° C.) | Liquidus Temp (° C.) | Liquidus Visc (kP) | Strain Pt (° C.) | Anneal Pt (° C.) | Soft Pt (° C.) | Density (g/cm$^3$) |
|---|---|---|---|---|---|---|---|---|
| 2-1 | 22.85 | 92.7 | 1085 | 573 | 612 | 668 | 925 | 2.428 |
| 2-2 | 16.89 | 92.6 | 1035 | 584 | 581 | 633 | 881 | 2.410 |
| 2-3 | 12.55 | 92.6 | 985 | 824 | 557 | 608 | 847 | 2.420 |
| 2-4 | 23.73 | 92.4 | 950 | 898 | 539 | 588 | 813 | 2.401 |
| 2-5 | 28.92 | 92.8 | 900 | >2000 | 522 | 570 | 789 | 2.388 |
| 2-6 | 1.96 | 92.5 | 1030 | 776 | 580 | 634 | 883 | 2.428 |
| 2-7 | 0.94 | 89.8 | 970 | 1326 | 557 | 607 | 849 | 2.427 |
| 2-8 | 13.67 | 84.7 | 1000 | 233 | 541 | 590 | 814 | 2.410 |
| 2-9 | 9.28 | 85.0 | 910 | >2000 | 569 | 624 | 864 | 2.407 |
| 2-10 | 6.76 | 88.0 | 790 | >2000 | 594 | 648 | 899 | 2.385 |
| 2-11 | 6.29 | 79.1 | 775 | >2000 | 524 | 576 | 821 | 2.369 |
| 2-12 | 3.33 | 82.3 | 770 | >2000 | 544 | 596 | 842 | 2.350 |
| 2-13 | 2.13 | 73.0 | 742 | >2000 | 493 | 541 | 779 | 2.330 |
| 2-14 | 2.53 | 74.9 | 760 | >2000 | 508 | 557 | 790 | 2.310 |
| 2-15 | 1.55 | 76.4 | 950 | 1106 | 543 | 591 | 819 | 2.394 |
| 2-16 | 1.94 | 82.1 | 770 | >2000 | 535 | 583 | 814 | 2.394 |
| 2-17 | 2.99 | 85.1 | 750 | >2000 | 526 | 577 | 819 | 2.392 |
| 2-18 | 5.25 | 87.0 | 940 | >2000 | 528 | 578 | 836 | 2.388 |
| 2-19 | 10.31 | 87.7 | 1155 | 68 | 536 | 589 | 849 | 2.384 |
| 2-20 | 5.09 | 87.5 | 770 | >2000 | 516 | 565 | 809 | 2.370 |
| 2-21 | 7.15 | 85.8 | 795 | >2000 | 513 | 561 | 789 | 2.377 |
| 2-22 | 4.59 | 84.6 | 760 | >2000 | 514 | 559 | 772 | 2.382 |
| 2-23 | 5.31 | 79.5 | 750 | >2000 | 526 | 571 | 776 | 2.385 |
| 2-24 | 9.19 | 87.1 | 750 | >2000 | 503 | 552 | 777 | 2.357 |
| 2-25 | 5.73 | 86.3 | 775 | >2000 | 498 | 544 | 760 | 2.366 |
| 2-26 | 3.97 | 84.1 | 770 | >2000 | 502 | 547 | 749 | 2.374 |
| 2-27 | 6.09 | 79.2 | 795 | >2000 | 511 | 554 | 744 | 2.377 |
| 2-28 | 9.89 | 85.4 | 715 | >2000 | 491 | 538 | 760 | 2.348 |
| 2-29 | 10.74 | 86.5 | 735 | >2000 | 487 | 533 | 735 | 2.355 |
| 2-30 | 14.37 | 84.9 | 750 | >2000 | 491 | 534 | 731 | 2.364 |
| 2-31 | 9.73 | 79.4 | 790 | >2000 | 501 | 544 | 726 | 2.368 |
| 2-32 | 5.28 | 81.3 | 765 | >2000 | 521 | 566 | 769 | 2.405 |

TABLE 4-continued

Properties of Exemplary Clad Glass Compositions

| Sample | Etch Rate (%) | CTE (× $10^{-7}$/° C.) | Liquidus Temp (° C.) | Liquidus Visc (kP) | Strain Pt (° C.) | Anneal Pt (° C.) | Soft Pt (° C.) | Density (g/cm³) |
|---|---|---|---|---|---|---|---|---|
| 2-33 | 6.34 | 80.9 | 910 | 294 | 524 | 566 | 753 | 2.435 |
| 2-34 | 12.74 | 88.4 | 1000 | 524 | 555 | 604 | 837 | 2.425 |
| 2-35 | 15.12 | 87.8 | 1000 | 281 | 545 | 591 | 813 | 2.439 |
| 2-36 | 14 | 87.4 | 1030 | 59 | 544 | 589 | 797 | 2.465 |
| 2-37 | 15.76 | 87.1 | 760 | >2000 | 523 | 570 | 800 | 2.385 |
| 2-38 | 17.13 | 88.2 | 750 | >2000 | 521 | 571 | 800 | 2.388 |
| 2-39 | 17.13 | 90.2 | 840 | >2000 | 521 | 570 | 794 | 2.394 |
| 2-40 | 7.86 | 83.6 | 800 | >2000 | 503 | 551 | 785 | 2.365 |
| 2-41 | 7.84 | 83.1 | 770 | >2000 | 495 | 544 | 770 | 2.361 |
| 2-42 | 12.58 | 82.8 | 800 | >2000 | 492 | 540 | 762 | 2.356 |
| 2-43 | 12.28 | 90.8 | 1000 | 773 | 553 | 601 | 841 | 2.428 |
| 2-44 | 12.89 | 91.4 | 990 | 366 | 545 | 592 | 821 | 2.432 |
| 2-45 | 22.9 | 92.7 | 970 | 292 | 534 | 577 | 771 | 2.442 |
| 2-46 | 22.1 | 92.1 | 970 | 149 | 528 | 572 | 766 | 2.450 |
| 2-47 | 24.44 | 94.5 | 960 | 90 | 524 | 564 | 743 | 2.459 |
| 2-48 | 28.93 | 94.5 | 950 | 89 | 519 | 559 | 735 | 2.461 |
| 2-49 | 22.85 | 80.0 | 765 | >2000 | 493 | 533 | 712 | 2.367 |
| 2-50 | 16.21 | 79.3 | 750 | >2000 | 484 | 525 | 702 | 2.355 |
| 2-51 | 16.89 | 80.0 | 775 | 1171 | 476 | 517 | 688 | 2.346 |
| 2-52 | 8.56 | 82.7 | 935 | 66 | 534 | 574 | 736 | 2.495 |
| 2-53 | 2.44 | 79.3 | 735 | >2000 | 508 | 556 | 798 | 2.343 |
| 2-54 | 2.68 | 78.5 | 795 | >2000 | 519 | 561 | 764 | 2.391 |
| 2-55 | 2.9 | 77.1 | 840 | >2000 | 515 | 557 | 744 | 2.382 |
| 2-56 | 2.14 | 75.9 | 765 | >2000 | 510 | 553 | 741 | 2.375 |
| 2-57 | 15.1 | 90.3 | 1010 | 150 | 534 | 579 | 798 | 2.442 |
| 2-58 | 9.66 | 89.6 | 1020 | 85 | 530 | 573 | 784 | 2.452 |
| 2-59 | 16.69 | 93.1 | 1020 | 150 | 532 | 576 | 791 | 2.439 |
| 2-60 | 3.02 | 89 | 800 | >2000 | 530 | 581 | 823 | 2.404 |
| 2-61 | 0.51 | 87.8 | 810 | >2000 | 514 | 564 | 800 | 2.395 |
| 2-62 | 2.84 | 76.7 | 740 | >2000 | 502 | 546 | 763 | 2.348 |
| 2-63 | 4.19 | 78 | 775 | >2000 | 500 | 542 | 737 | 2.355 |
| 2-64 | 15.63 | 94.5 | 970 | 414 | 609 | 664 | 928 | 2.427 |
| 2-65 | 14.96 | 87.5 | 1070 | 10 | 544 | 584 | 762 | 2.513 |
| 2-66 | 13.29 | 83.6 | 990 | 28 | 534 | 573 | 739 | 2.508 |
| 2-67 | 13.1 | 88.9 | 1020 | 42 | 531 | 574 | 764 | 2.473 |
| 2-68 | 0.05 | 84.4 | 990 | >2000 | 630 | 704 | 957 | 2.422 |

As shown in Tables 2 and 4, the exemplary clad glass compositions are less durable (i.e., have higher etch rates) than the exemplary core glass compositions in the selected etchant (i.e., 50% HCl).

A structured article is formed as described herein and comprises a glass core layer formed from an exemplary core glass composition (e.g., Sample 1-1 to 1-4) and a glass cladding layer formed from an exemplary clad glass composition (e.g., Sample 2-1 to 2-68).

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. An electronic package assembly comprising:
   a glass substrate comprising:
      an upper glass cladding layer;
      a lower glass cladding layer;
      a glass core layer fused to the upper glass cladding layer and the lower glass cladding layer, wherein the upper glass cladding layer and the lower glass cladding layer have a higher etch rate in an etchant than the glass core layer;
      a first cavity positioned within one of the upper glass cladding layer or the lower glass cladding layer; and
      a second cavity positioned within one of the upper glass cladding layer or the lower glass cladding layer;
   a microprocessor positioned within the first cavity; and
   a micro-electronic component positioned within the second cavity.

2. The electronic package assembly of claim 1, wherein the upper glass cladding layer has a thickness that is different than a thickness of the lower glass cladding layer.

3. The electronic package assembly of claim 1, wherein the micro-electronic component comprises a memory chip positioned within the second cavity.

4. The electronic package assembly of claim 3, wherein the first cavity is positioned on the lower glass cladding layer.

5. The electronic package assembly of claim 3, wherein the second cavity is positioned on the upper glass cladding layer.

6. The electronic package assembly of claim 3, wherein the first cavity and the second cavity are positioned on the lower glass cladding layer.

7. The electronic package assembly of claim 3, wherein the glass substrate further comprises a third cavity, and the electronic package assembly further comprises a second micro-electronic component positioned within the third cavity of the glass substrate.

8. The electronic package assembly of claim 7, wherein the third cavity and the second cavity are positioned on the same glass cladding layer.

9. The electronic package assembly of claim 3, further comprising:
   a thermal via extending through the glass substrate and thermally coupled to the microprocessor; and
   a heat spreader thermally coupled to the thermal via.

10. The electronic package assembly of claim 1, wherein the upper glass cladding layer and the lower glass cladding layer have a photosensitivity that is different than a photosensitivity of the glass core layer.

11. The electronic package assembly of claim 1, further comprising:
    a plurality of solder bumps positioned on a single surface of the electronic package assembly; and
    a plurality of vias extending between the plurality of solder bumps and the microprocessor and between the plurality of solder bumps and the micro-electronic component.

12. A wafer-level electronic package assembly comprising:
    a glass substrate comprising:
        an upper glass cladding layer;
        a lower glass cladding layer;
        a glass core layer fused to the upper glass cladding layer and the lower glass cladding layer, wherein the upper glass cladding layer and the lower glass cladding layer have a higher etch rate in an etchant than the glass core layer;
        a plurality of first cavities positioned within one of the upper glass cladding layer or the lower glass cladding layer; and
        a plurality of second cavities positioned within one of the upper glass cladding layer or the lower glass cladding layer;
    a plurality of microprocessors positioned within the plurality of first cavities; and
    a plurality of micro-electronic components positioned within the plurality of second cavities.

13. The wafer-level electronic package assembly of claim 12, further comprising:
    a plurality of solder bumps positioned on a single surface of the electronic package assembly; and
    a plurality of vias extending between the plurality of solder bumps and the plurality of microprocessors and between the plurality of solder bumps and the plurality of micro-electronic components.

14. The wafer-level electronic package assembly of claim 13, wherein the upper glass cladding layer has a thickness that is different than a thickness of the lower glass cladding layer.

15. The wafer-level electronic package assembly of claim 12, further comprising a plurality of passive RF devices positioned on a top surface of the electronic package assembly.

16. A method for forming an electronic package assembly, the method comprising:
    applying a mask to a surface of a glass substrate comprising a glass cladding layer fused to a glass core layer such that the mask is positioned on the glass cladding layer, the mask comprising one or more open regions at which the glass cladding layer remains uncovered by the mask, the glass cladding layer having a higher etch rate in an etchant than the glass core layer;
    exposing the glass substrate to the etchant, thereby selectively etching a portion of the glass cladding layer and forming one or more cavities in the glass substrate; and
    positioning a micro-electronic component within the one or more cavities of the glass substrate.

17. The method of claim 16, wherein exposing the glass substrate to the etchant comprises selectively etching all of the glass cladding layer at the one or more open regions.

18. The method of claim 16, wherein the glass cladding layer of the glass substrate is an upper glass cladding layer and the glass substrate further comprises a lower glass cladding layer fused to the glass core layer on a surface opposite the upper glass cladding layer, and the method further comprises applying the mask to a surface of the lower glass cladding layer, the mask comprising one or more open regions at which the lower glass cladding layer remains uncovered.

19. The method of claim 18, wherein exposing the glass substrate to the etchant further comprises selectively etching a portion of the lower glass cladding layer and forming one or more cavities in the lower glass cladding layer.

20. The method of claim 18, wherein exposing the glass substrate to the etchant comprises selectively etching all of the lower glass cladding layer at the one or more open regions.

* * * * *